United States Patent
Srinivasan et al.

(12) 
(10) Patent No.: US 6,898,099 B1
(45) Date of Patent: May 24, 2005

(54) CONTENT ADDRESSABLE MEMORY HAVING DYNAMIC MATCH RESOLUTION

(75) Inventors: Varadarajan Srinivasan, Los Altos Hills, CA (US); Bindiganavale S. Nataraj, Cupertino, CA (US); Sandeep Khanna, Los Altos, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/679,073

(22) Filed: Oct. 2, 2003

Related U.S. Application Data

(63) Continuation-in-part of application No. 10/112,630, filed on Mar. 29, 2002, now Pat. No. 6,661,686.

(51) Int. Cl.[7] .............................................. G11C 15/00
(52) U.S. Cl. ........................ 365/49; 365/189.7; 711/108
(58) Field of Search .............................. 365/49, 189.07, 365/189.05, 233, 189.12; 771/108

(56) References Cited

U.S. PATENT DOCUMENTS 6,195,277 B1    2/2001  Sywyk et al.
6,199,140 B1    3/2001  Srinivasan et al.
6,230,236 B1    5/2001  Schultz et al.
6,351,143 B1    2/2002  Guccione et al.
6,400,592 B1    6/2002  Peterson
6,697,276 B1 *  2/2004  Pereira et al. ................ 365/49
2002/0093347 A1 7/2002  Henderson et al.

OTHER PUBLICATIONS

IBM Technical Disclosure Bulletin, "Self–Timed Hit Circuit for a Content Addressable Memory," vol. 38, No. 2, Feb. 1995, pp. 65–66 plus cover and end page; total 4 pages.

* cited by examiner

Primary Examiner—David Lam
(74) Attorney, Agent, or Firm—Shemwell Gregory & Courtney LLP

(57) ABSTRACT

A content addressable memory (CAM) architecture. For one embodiment, the CAM architecture includes a plurality of rows of CAM cells, each row configured to generate match results on a corresponding match line, a number of comparand lines, each coupled to a corresponding CAM cell in each of the plurality of rows of CAM cells, a plurality of timed storage circuits, each having a data input coupled to a corresponding match line and having an enable input coupled to an enable signal line, a timing generator configured to generate an enable signal on the enable signal line, and a plurality of load elements.

48 Claims, 18 Drawing Sheets

CONTENT ADDRESSABLE MEMORY HAVING DYNAMIC MATCH RESOLUTION

CROSS-REFERENCE TO RELATED APPLICATION

This application is a continuation-in-part, and claims benefit under 35 USC §120, of commonly owned, U.S. patent application Ser. No. 10/112,630 filed Mar. 29, 2002 now U.S. Pat. No. 6,661,686 and entitled "Content Addressable Memory Having Dynamic Match Resolution," which is incorporated by reference herein.

FIELD OF INVENTION

The field of invention relates generally to the semiconductor arts; and, more specifically, to a method and apparatus for a content addressable memory (CAM) having dynamic match resolution.

BACKGROUND

Content addressable memories (CAMs) can be used within a wealth of different electronic systems (e.g., computing systems such as laptop computers, personal computers (PCs), servers, etc.; networking systems such as routers, switches, base stations, etc.; etc.,). Often, a CAM is used to perform a "look-up" function. For example, in networking applications, a portion of the header information of a packet is often used as a search key or comparand to look-up or identify an entry in the CAM. The address at which the matching entry is located in the CAM can then be used to address or index a location in associated memory where attributes as to how the packet is to be handled are found (e.g., an attribute that identifies the priority level of the packet, an attribute that identifies the specific fiber-optic cable over which the packet is to be launched, etc.).

FIG. 1 shows an example of at least a portion 100 of a CAM architecture. According to the depiction of FIG. 1, CAM architecture 100 includes a plurality ("K") of rows of CAM cells $140_1$ through $140_K$. Each CAM cell includes a memory storage element and a compare circuit and can be binary (i.e., effectively stores and compares on two logic states—logic 0 and logic 1) or ternary (i.e., effectively stores and compares on three logic states—logic 0, logic 1, and a don't care state).

A comparand is typically registered in comparand register 108 and then compared with the data values stored within the plurality of CAM cells 140. The comparison results are reflected as match signals on corresponding match signal lines $110_1$–$110_K$. The match signals are typically then latched by latch 102. Latch 102 has K latch circuits $102_1$–$102_K$ that each latch a corresponding match signal state in response to the latch enable signal generated by timing generator 103. The latch enable signal is typically generated in response to a cycle clock and control signal CMP that indicates when a compare operation is taking place.

The latched match signals are provided to priority encoder 105 and flag logic 113 over signal lines $104_1$–$104_K$. Priority encoder 105 processes the match signals in a predetermined manner to determine which of the matching entries (i.e., those data values in the CAM array that match the comparand) is the highest priority matching entry. An index or address of the highest priority matching entry in the CAM array is then output from priority encoder 105 over signal lines 106. Flag logic 113 typically generates a match flag signal that indicates if one or more of the match signals indicates a match, and thus qualifies the output of the priority encoder.

Semiconductor integrated circuit (IC) designers typically specify minimum performance levels that the IC will meet or exceed across a wide range of operating conditions of a CAM device. The operating conditions include environmental conditions (e.g., temperature, moisture content in the operating environment, pressure, etc.), electrical conditions (e.g., supply voltage, input and output voltages, currents and loading, etc.), manufacturing variations (e.g., fabrication variations in transistor geometries and properties, material geometries and properties, etc., which are commonly referred to as "process variations"), and functional considerations (e.g., which operations have been performed by the device and which operations are currently being performed by the device, etc.).

With respect to CAM architecture 100, timing generator 103 is typically designed using simulation tools to transition the latch enable signal at a point in time when all of the match signals are stable after a compare operation. As such, the timing generator is typically designed to transition the latch enable signal to capture accurate match results even under worst case operating conditions. Worst case operating conditions are typically high operating temperature, low supply voltage, slow fabrication geometries, and the slowest time required for CAM array 140 to perform a match and/or a mis-match operation. Although this design approach may guarantee a minimum performance under worst case operating conditions, it sacrifices better performance that could have been realized under better than worst case operating conditions. This can adversely affect the rated performance of the CAM device and can decrease the overall operating frequency, speed or throughput of the device. For example, the longer time that is required to latch the match signals, the later in a particular clock cycle (e.g., of the cycle clock) that it takes for the priority encoder and flag logic to perform their respective operations. This slows down the maximum operating speed of the device.

Additionally, timing generator 103 is typically designed as a pulse generator (e.g., a one-shot) and/or a delay circuit (e.g., one or more inverting or non-inverting buffer circuits or resistor-capacitor (RC) circuits). Since these circuits are designed differently than CAM array 140 (i.e., do not include CAM cells), as operating conditions change the latch enable signal output by timing generator 103 typically does not track in time or voltage proportionally with changes to the match results provided on match lines 110. This variation is further simulated and accounted for during design, and typically results in additional delay added to the point in time at which the latch enable signal is designed to transition.

FIGURES

The present invention is illustrated by way of example, and not limitation, in the Figures of the accompanying drawings in which.

Like reference numerals refer to corresponding parts throughout the drawing figures.

DESCRIPTION

Figure 1:
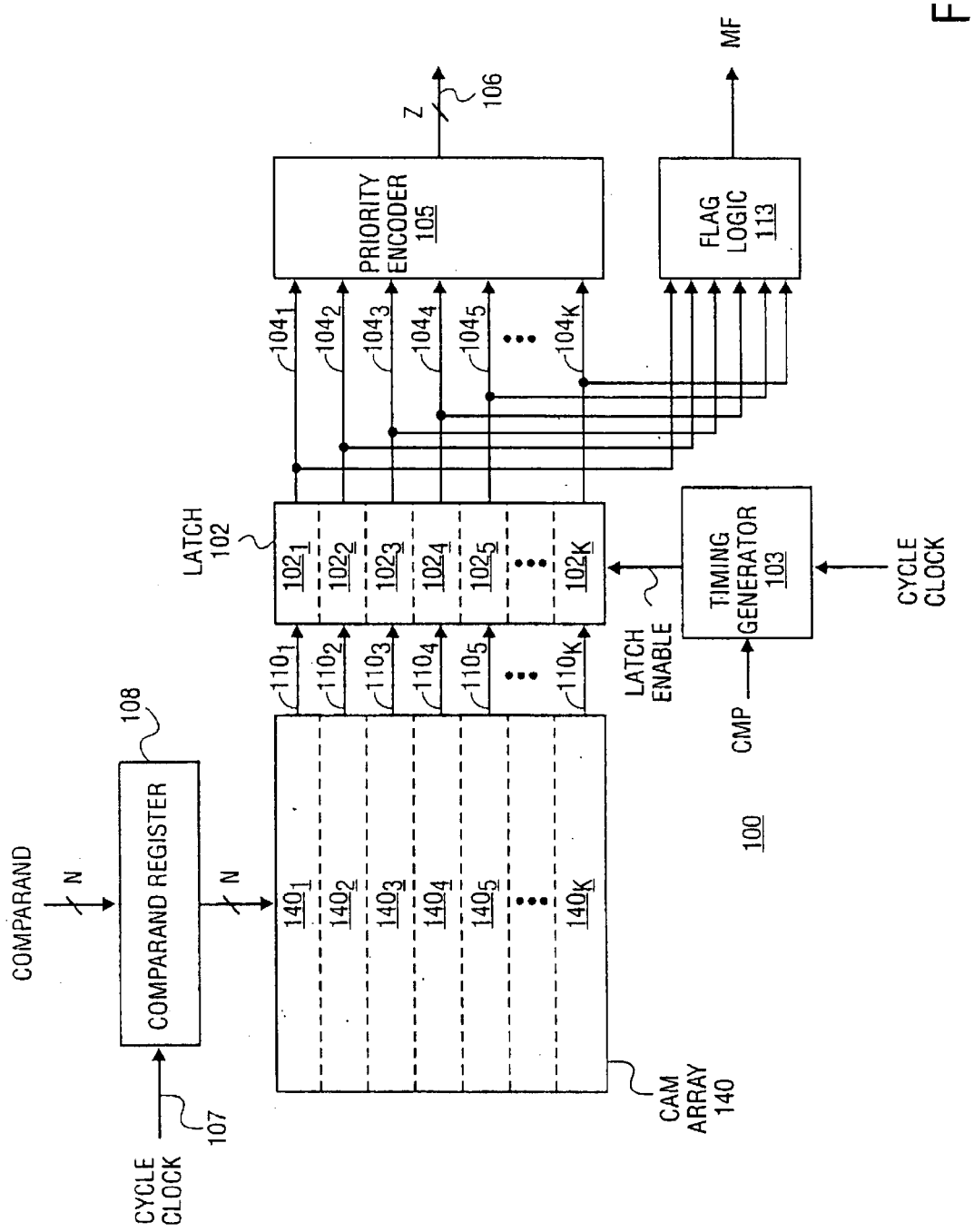
FIG. 1 shows an example of a portion of a CAM architecture.

In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements or blocks may be shown as buses or as single signal lines. Each of the buses may alternatively be single signal lines, and each of the single signal lines may alternatively be buses. A signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signal name>') is also used to indicate an active low signal. Active low signals may be changed to active high signals and vice-versa as is generally known in the art. Additionally, the term "coupled" as used herein refers to the direct or indirect connection through one or more intervening circuits.

A CAM architecture is disclosed that dynamically adjusts its match resolution timing in response to the applicable operating conditions under which the CAM architecture operates such that the CAM architecture can exhibit improved operating performance (e.g., operating speed, throughput, etc.) during a compare operation relative to a CAM architecture designed according to traditional approaches. The CAM architecture includes a dynamic timing generator that performs one or more compare operations to parallel the operation of a CAM array. Thus, the CAM architecture employs the dynamic timing generator to "self-time" capture of match results from the CAM array. The dynamic timing generator outputs an enable signal to capture the match results from the CAM array, and dynamically adjusts the output of the enable signal as operating conditions change (e.g., a change in temperature or a degradation in transistor gain).

For example, if operating conditions improve such that faster compare operations are realized by the CAM array, the dynamic timing generator adjusts its enable signal such that match results from the CAM array are captured earlier in time than under relatively slower operating conditions. Likewise, as operating conditions degrade such that slower compare operations are realized by the CAM array, the dynamic timing generator adjusts its enable signal such that match results from the CAM array are captured later in time than under relatively faster operating conditions. As such, the match results can be captured as soon as they are available from the CAM array.

Figure 2:
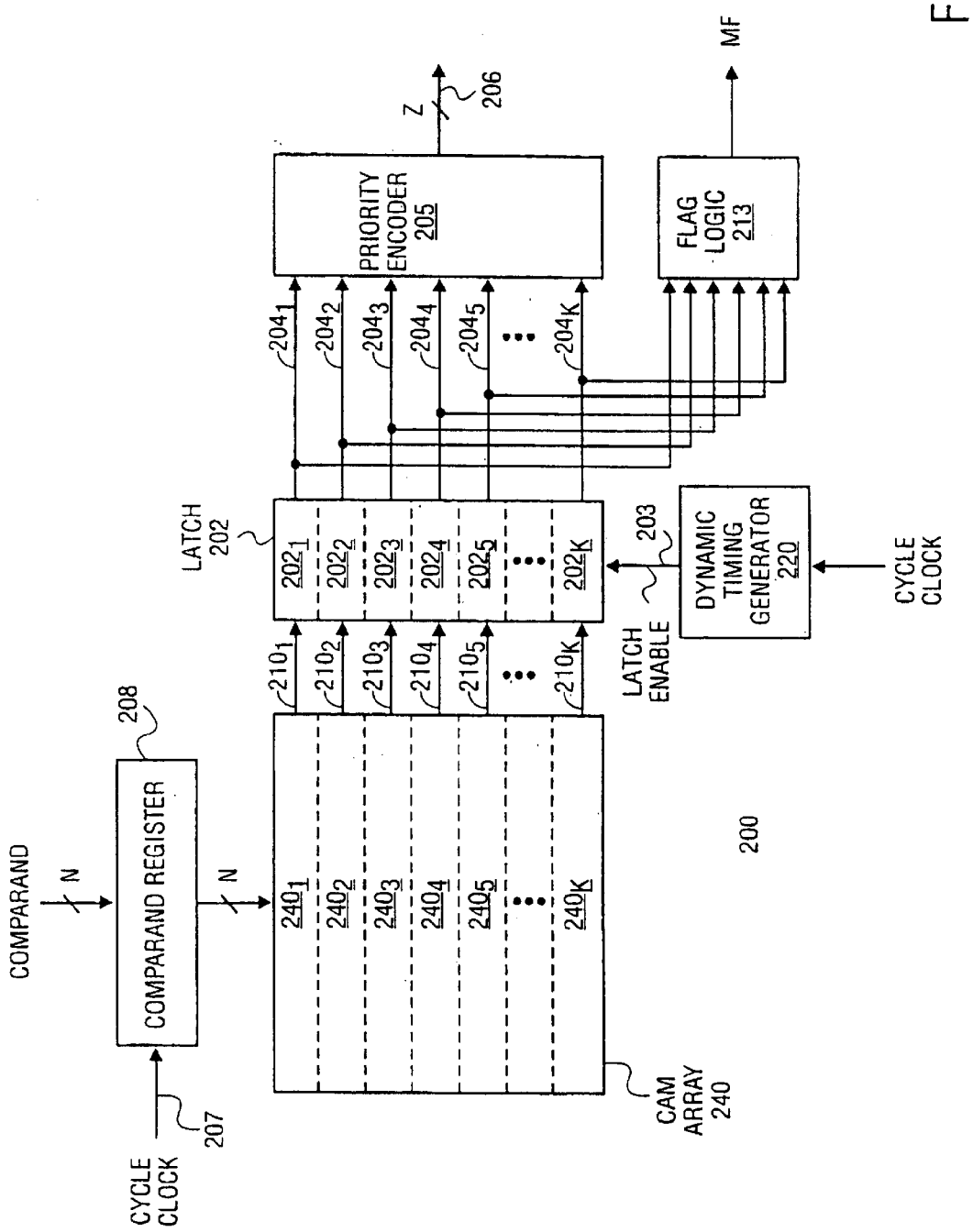
FIG. 2 shows an embodiment of a portion of a CAM architecture including a dynamic timing generator.
Figure 16:
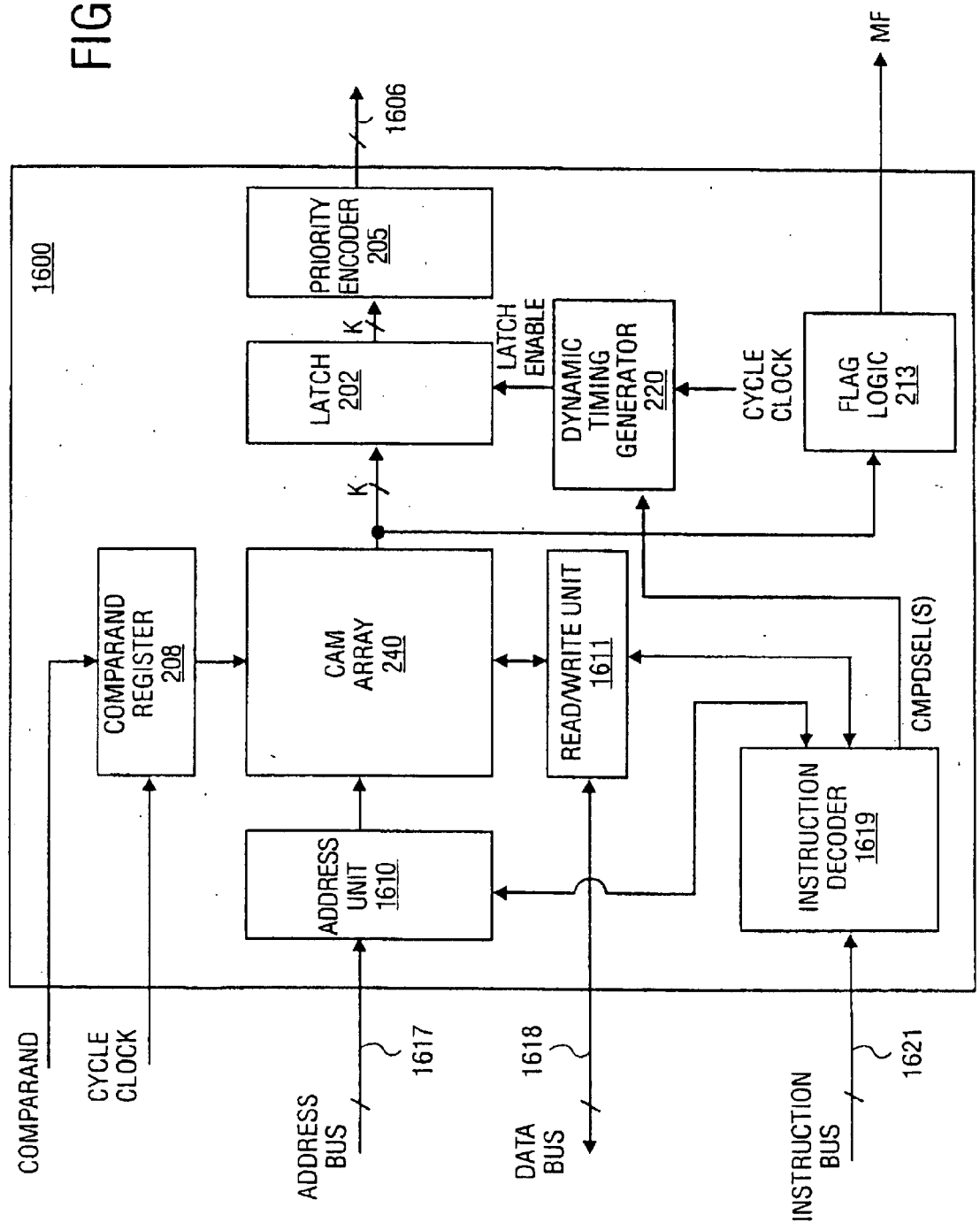
FIG. 16 shows an embodiment of a CAM device that includes the CAM architecture of FIG. 2.

FIG. 2 shows an embodiment of at least a portion of a CAM architecture 200 having dynamically adjustable match resolution as described just above. CAM architecture 200 includes comparand register 208, CAM array 240, latch 202, priority encoder 205, flag logic 213, and dynamic timing generator 220. The CAM architecture may include other circuits (e.g., as shown in FIG. 16) including, for example, a control circuit or instruction decoder that decodes instructions (e.g., compare instructions) and provides control signals to one or more of the circuit blocks, read circuitry and write circuitry for the CAM array, address circuitry, configurability circuits to configure the width and/or depth of the CAM array, error detection and/or correction circuitry, and the like.

CAM array 240 includes K of rows of CAM cells $240_1$–$240_K$. Each CAM cell includes at least one memory storage element and at least one compare circuit and can be binary (i.e., effectively stores and compares on two logic states—logic 0 and logic 1) or ternary (i.e., effectively stores and compares on three logic states—logic 0, logic 1, and a don't care state). A comparand is typically registered in comparand register 208 and then compared with the data values stored within the plurality of CAM cells 240. Comparand register 208 is optional. The comparison results are reflected as match signals on corresponding match signal lines $210_1$–$210_K$. The match signals are typically then latched by latch 202. Latch 202 has K latch circuits $202_1$–$202_K$ that each latch a corresponding match signal state in response to the latch enable signal 203 generated by dynamic timing generator 220. The latch enable signal 203 is typically generated in response to a cycle clock, and may also be generated in response to a control signal that indicates when a compare operation is taking place. The control signal may be generated, for example, by a control circuit or instruction decoder that detects when a compare operation is to take place on the CAM array. Latch 202 may also be any type of timed or clocked storage circuit including, for example, a register (e.g., a flip-flop) or other timed memory circuit.

The latched match signals are provided to priority encoder 205 and flag logic 213 over signal lines $204_1$–$204_K$. Priority encoder 205 processes the match signals in a predetermined manner to determine which of the matching entries (i.e., those data values in the CAM array that match the comparand) is the highest priority matching entry. An index or address of the highest priority matching entry in the CAM array is in then output from priority encoder 205 over signal lines 206. For other embodiments, the priority encoder may be an encoder and not a priority encoder.

Flag logic 213 generates a match flag signal that indicates if one or more of the match signals indicates a match, and thus qualifies the output of the priority encoder. The flag logic may also indicate the fill state of the CAM array by, for example, outputting a full flag signal, an empty signal or a partially full flag signal (e.g., by monitoring one or more valid bits each associated with an entry in the CAM array).

Figure 3:
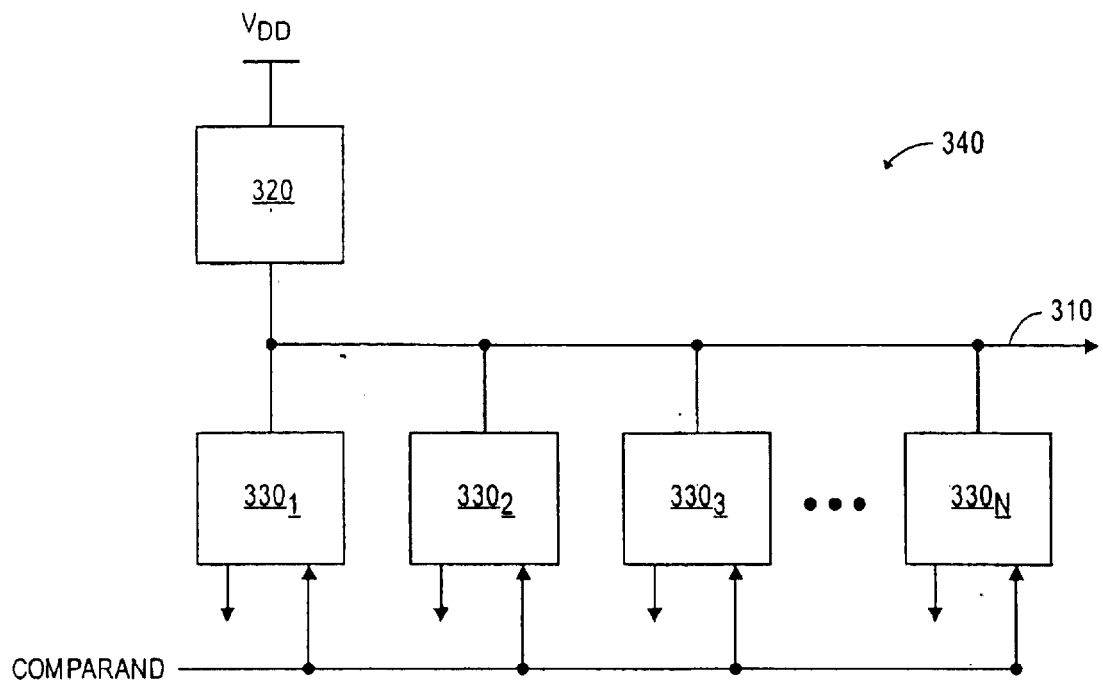
FIG. 3 shows one embodiment of a row of CAM cells.

FIG. 3 shows a row of CAM cells 340 that is one example of a row of CAM cells 240 of FIG. 2. Row 340 includes pre-charge circuit 320 and N CAM cells 330. Pre-charge circuit 320 is any type of pre-charge circuit that charges match line 310 towards the power supply rail VDD. Each of the N CAM cells may be binary, ternary or other types of CAM cells, that each include at least one memory storage element for storing data and at least one compare circuit for comparing at least bit of the comparand with the stored bit in the CAM cell. Row 340 will be generally referred to hereafter as "NOR-based" because if any compare circuit within a particular CAM cell determines that its stored data bit does not match a corresponding bit in the comparand, then the match line is discharged by the CAM cell towards ground. Only if all of the CAM cells store data that matches corresponding bits in the comparand will the match line remain in a pre-charged state.

Figure 4:
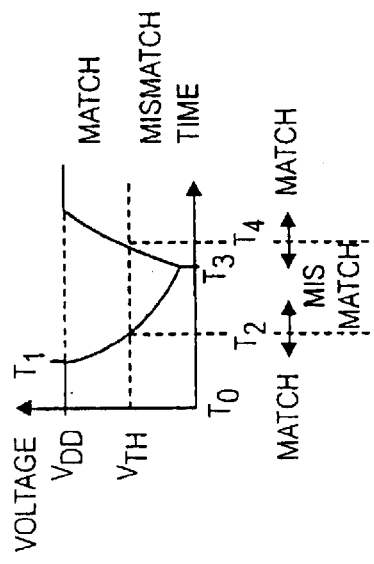
FIG. 4 shows an exemplary timing diagram of the operation of the row of CAM cells of FIG. 3.

This operation is further shown in FIG. 4 in which from time T0 to time T1 there is a match state. At time T1 there is at least one CAM cell that stores a bit that mis-matches a corresponding bit in the comparand, and that CAM cell starts to discharge the match line towards ground. At time T2, the voltage on match line 310 crosses VTH, which is the voltage that delineates a match from a mis-match state on the match line. At time T3, a match condition is again determined. At time T4 the match condition is represented on match line 310.

Figure 5:
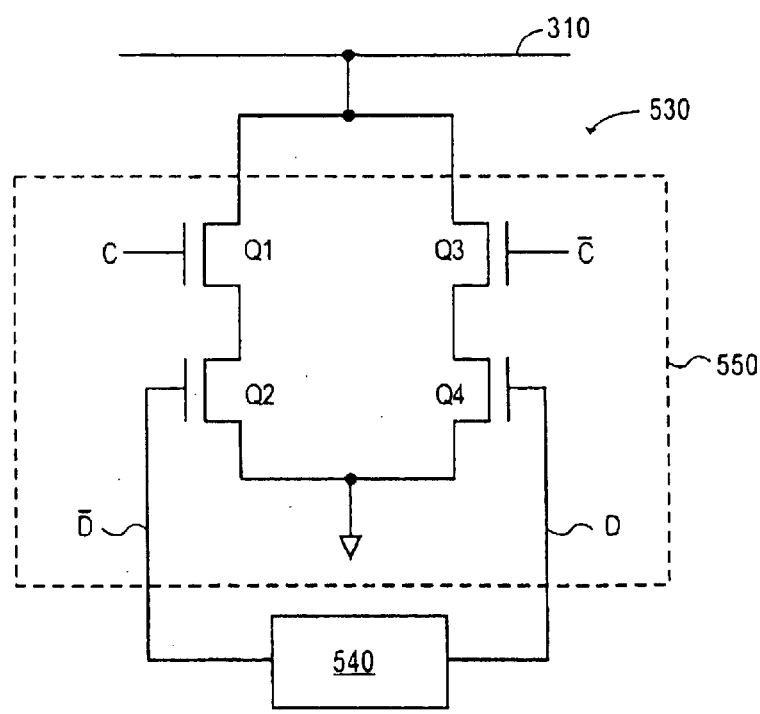
FIG. 5 shows an embodiment of a binary CAM cell.

FIG. 5 shows binary CAM cell 530 that is one embodiment of any of CAM cells 330 of FIG. 3. CAM cell 530 includes a memory cell 540 and a compare circuit 550. Memory cell 540 may be any type of memory cell including a SRAM cell, DRAM, cell or any other type of volatile or non-volatile memory cell. As shown, both the data bit and its logical complement stored in memory cell 540 are provided to respective gates of transistor Q4 and Q2. Transistor Q2 is coupled in series with transistor Q1 between the match line and ground. Transistor Q1 has its gate coupled to a bit of comparand data C. Similarly, transistor Q4 is coupled in series with transistor Q3 between the match line and ground. Transistor Q4 has its gate coupled to receive the logical complement of the comparand bit. As shown in FIG. 5, if the stored data and the comparand are the same logical state (i.e., match), then no path to ground is established for the match line. If, however, they do not have the same logical state (i.e., do not match), then a discharge path to ground exists for the match line. Other embodiments of compare circuit may be used.

Figure 6:
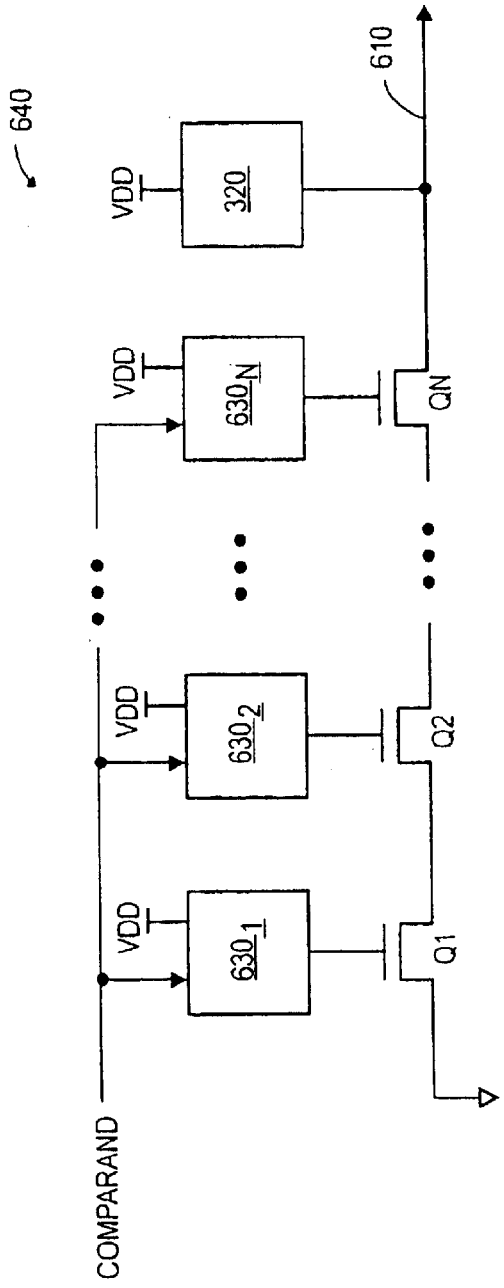
FIG. 6 shows another embodiment of a row of CAM cells.

FIG. 6 shows a row of CAM cells 640 that is another embodiment of any of the row of CAM cells of FIG. 2. Row 640 includes pre-charge circuit 320, N CAM cells $630_1$–$630_N$, and N pass transistors Q1–QN. Each of the N CAM cells $630_1$–$630_N$ may be binary, ternary or other types of CAM cells, that each include at least one memory storage element for storing data and at least one compare circuit for comparing at least one bit of the comparand with the stored bit in the CAM cell. Row 640 will be referred to generally hereafter as "NAND-based" because the match line is discharged toward ground only if all of the compare circuits within the CAM cells determine that its stored data matches the comparand. When a CAM cell stores data that matches a corresponding bit in the comparand, it sends a signal to the gate of its corresponding pass transistor to turn on the transistor. If any one of the CAM cells stores data that does not match a corresponding bit in the comparand, the corresponding pass transistor is turned off and the match line remains pre-charged towards VDD.

Figure 7:
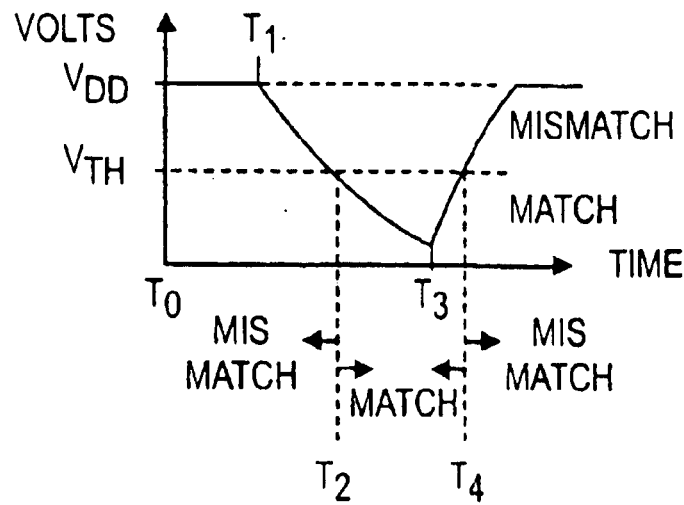
FIG. 7 shows an exemplary timing diagram of the operation of the row of CAM cells of FIG. 6.

This operation is further shown in FIG. 7 in which from time T0 to time T1 there is a mis-match state. At time T1 all of stored bits match the comparand such that all of the pass transistors are enabled to discharge the match lines towards ground. At time T2, the voltage on match line 310 crosses VTH, which is the voltage that delineates a match from a mis-match state on the match line. At time T3, a mis-match condition is again determined. At time T4 the mis-match condition is represented on match line 610.

Returning again to FIG. 2, dynamic timing generator 220 transitions the latch enable signal to cause latch 202 to capture the match results when all of the match signals accurately reflect the current compare results. In contrast to timing generator 103 of FIG. 1, dynamic timing generator 220 performs one or more compare operations to parallel the operation of CAM array 240. Thus, as the generation of the match signals is increased or decreased in time by the operation of CAM array 240 under various operating conditions, the dynamic timing generator similarly and proportionally dynamically adjusts the time at which it transitions the latch enable signal. As such, CAM architecture 200 "self-times" when to capture the match results enabling them to be captured as soon as they are stable on the match lines.

For example, because dynamic timing generator 220 performs a parallel comparison operation as that performed by CAM array 240, if operating conditions improve such that faster compare operations are realized by the CAM array, the dynamic timing generator adjusts the transition of the latch enable signal by a substantially proportional amount such that match results from the CAM array are captured earlier in time than under relatively slower operating conditions. This may allow the CAM architecture to run at higher frequencies under faster operating conditions. Likewise, as operating conditions degrade such that slower compare operations are realized by the CAM array, the dynamic timing generator adjusts the transition of the latch enable signal by a substantially proportional amount such that match results from the CAM array are captured later in time than under relatively faster operating conditions.

Figure 8:
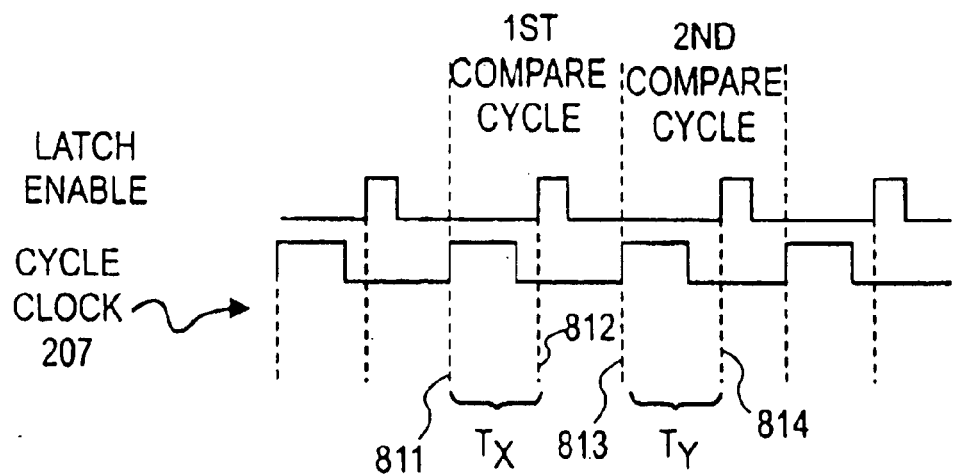
FIG. 8 shows an exemplary timing diagram of the dynamic operation of the dynamic timing generator of FIG. 2.

For example, as shown in FIG. 8, if a new comparand begins to be analyzed on the rising edge of a cycle clock signal 207, and the match results are latched on the rising edge of the latch enable signal, then using the rising edges 811 and 813 of the cycle clock 207, respectively, as a reference point for both latch times 812 and 814, note that the first latch time 812 is observed after time period Tx for a first compare cycle, and the second latch time 814 is observed as time period Ty for a second compare cycle. Note that time period Ty is longer in time than time period Tx. The second compare cycle represents operating conditions that cause CAM architecture 200 to operate slower (i.e., generate accurate match results slower) than in the first compare cycle. This difference in time periods demonstrates that the latch time of the CAM architecture can be dynamically adjusted. Furthermore, in at least one embodiment, a new latch time can be established with each new comparand. As such, the CAM approach of FIG. 2 is able to vary the latch timing on a comparand-by-comparand basis.

By having dynamic timing generator 220 perform a substantially similar compare operation as that performed by CAM array 240, the dynamic timing generator can be designed to transition the latch enable signal at a time that more quickly (i.e., as opposed to conventional simulation designs) indicates when the match signals accurately reflect the match results from the CAM array for a given compare operation. This advantageously improves the speed at which the match results are latched and when the priority encoder can output a matching index, and when the flag logic can output a match result. Consequently, this can improve the operating frequency, speed and throughput of the CAM architecture over conventional designs.

Figure 9:
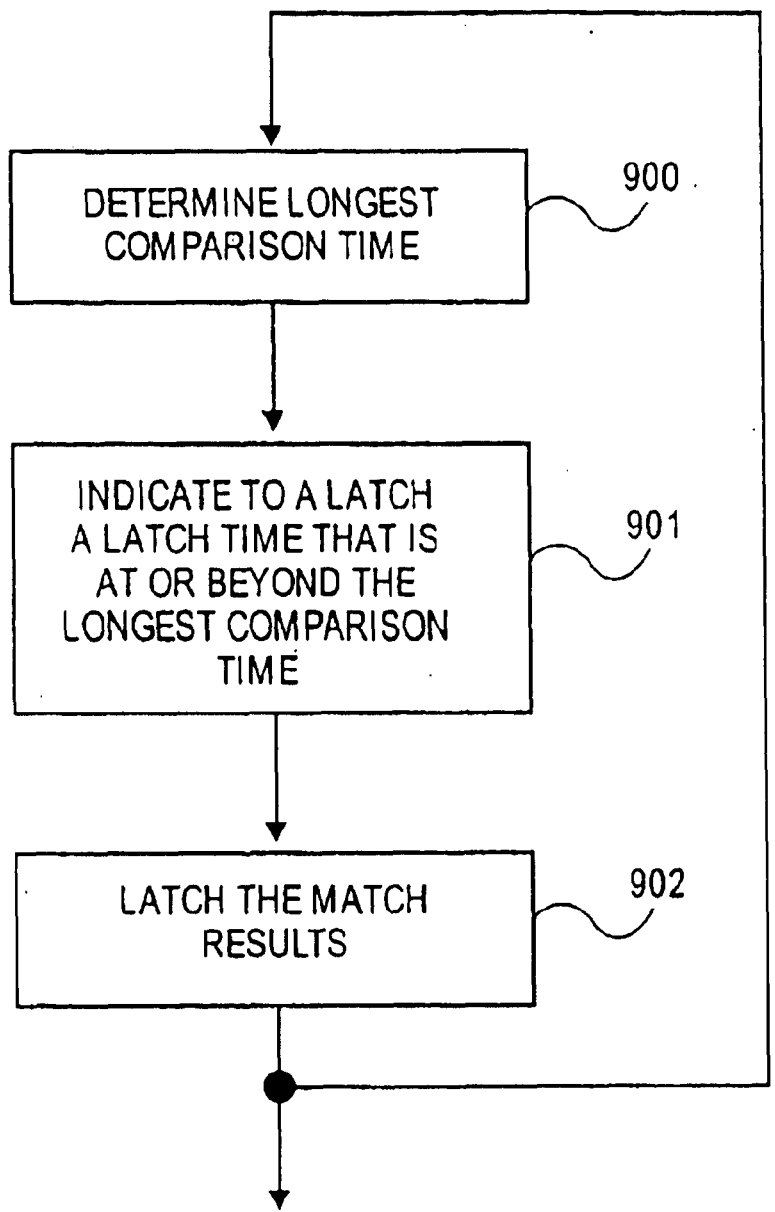
FIG. 9 illustrates the operation of the CAM architecture of FIG. 2.

FIG. 9 illustrates one embodiment of the operation dynamic timing generator 220 and latch 202. For this embodiment, 900 and 901 are performed by dynamic timing generator 220, and 902 is performed by latch 202. The amount of time that the CAM array 204 uses to determine its match results on match will be referred to hereafter as a "comparison time", a "compare time" or the like.

At 900, while a comparison operation is being performed by the CAM array, dynamic timing generator 220 determines the longest or worst case comparison time that the CAM array should experience for the given operating conditions. For one example, dynamic timing generator 220 determines the longest comparison time by performing its own parallel comparison operations (with the supplied comparand or with a predetermined, pre-stored comparand) to mirror the operation of the CAM array. The parallel comparison operations may include comparison operations that generate both match and mis-match results so as to mirror the slowest functional operation that any row of the CAM array could experience in a given compare operation.

Once dynamic timing generator 220 determines the longest comparison time, the dynamic timing generator transitions the latch enable signal at 901 such that the match results on match signal lines 210 are captured by latch 202 (at 902) at or beyond the just determined longest comparison time. As a result, the match results are latched as soon as practicable under the applicable operating conditions. This can avoid idling for significant amounts of time prior to latching match results from the CAM array once they are ready to be latched.

Note that the process of FIG. 9 can be continually repeated so that an appropriate latch time is continually re-determined over the course of operation of the CAM architecture. As such, as described above, the CAM can dynamically adjust to changes in operating conditions that arise during its operation. In one embodiment, the process is continually repeated to generate a new latch enable signal in every clock cycle. Alternatively, a new latch enable signal may be generated at a frequency slower than every clock cycle.

It is important to point out that numerous embodiments may differ with respect to the manner in which dynamic timing generator 220 establishes the latch timing for latch 202. For example, according to at least one approach, a plurality of comparison time measurements are undertaken in order to monitor a plurality of circumstances that could noticeably affect the compare operation of CAM array 240.

Figure 10:
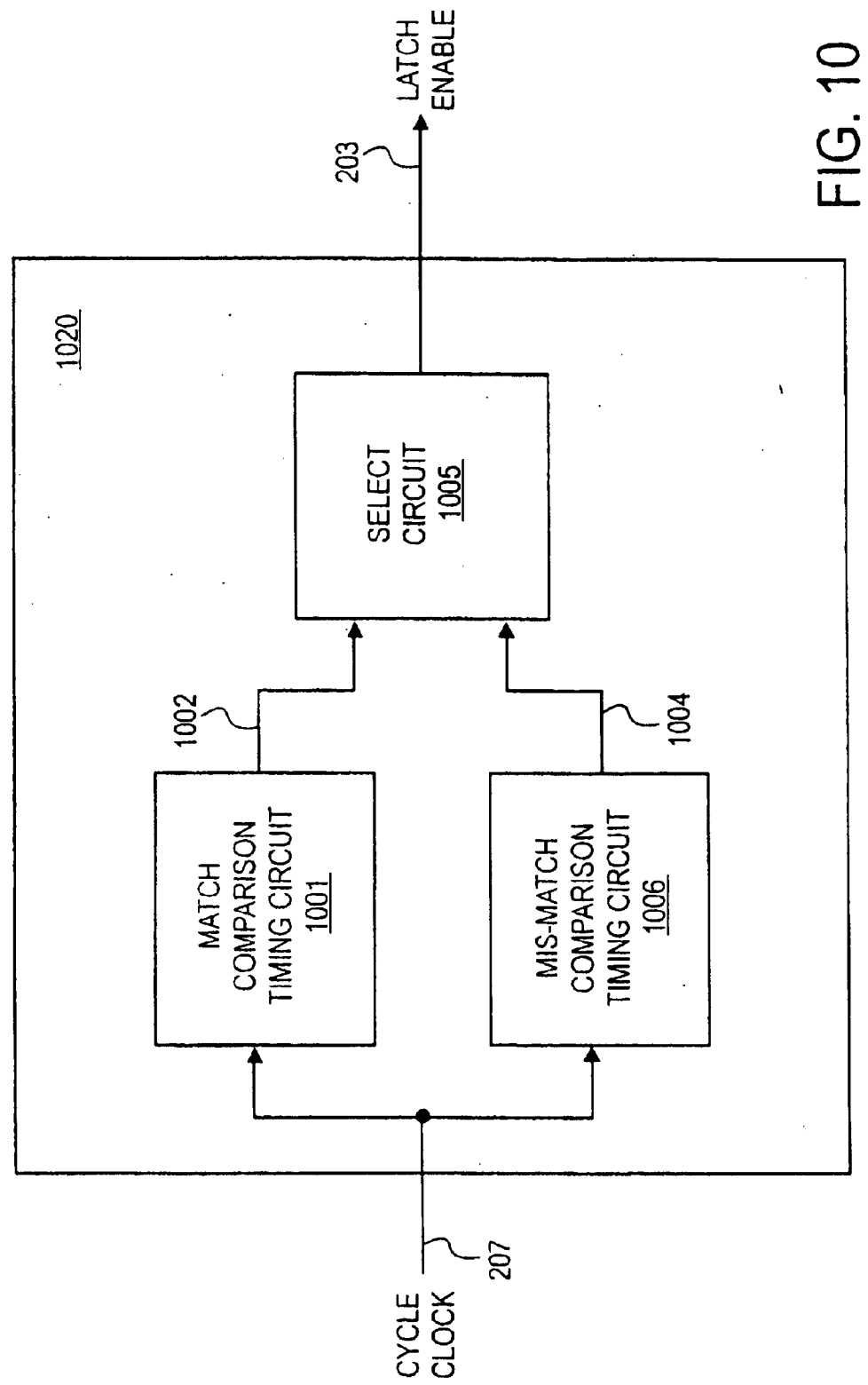
FIG. 10 shows an embodiment of the dynamic timing generator of FIG. 2.

FIG. 10 illustrates dynamic timing generator 1020 that is one embodiment of dynamic timing generator 220 of FIG. 2. Dynamic timing generator 1020 includes match comparison timing circuit 1001, mis-match comparison timing circuit 1006, and select circuit 1005. Each of the comparison timing circuits 1001 and 1006 performs compare operations to mirror or parallel the similar worst-case match and mis-match comparison operations performed by CAM array 240. Various timing circuit designs may be used to perform the parallel comparison operations including using one or more duplicate rows of CAM cells such as those used in the CAM array.

Each comparison timing circuit 1001 and 1006 outputs a comparison result signal at respective outputs 1002 and 1004. The comparison result signals are indicative of the time required to complete the corresponding match or mis-match operation. Select circuit 1005 selects the slower of the comparison result signals to determine when to transition the latch enable signal 203. That is, select circuit 1005 effectively recognizes which of the match and mis-match comparison times performed by timing circuits 1001 and 1006 represents the slowest comparison time. This slowest comparison time is also indicative of the slowest possible comparison time that any given row of the CAM array may take to resolve its own match results.

Dynamic timing generator 1020 uses comparison timing circuits 1001 and 1006 to mirror the two operations and results (i.e., match and mis-match compare operations) that a given row of CAM cells in the CAM may experience during a compare operation. For one embodiment, match comparison timing circuit 1001 includes a row of CAM cells or compare circuits (manufactured in a similar manner to, and including substantially similar circuit components to, those in the CAM array) that performs a compare operation with a pre-stored comparand such that the comparison always generates a match (e.g., as a match signal on output 1002). Similarly, mis-match comparison timing generator circuit 1006 may include a row of CAM cells or compare circuits (manufactured in a similar manner as to, and including substantially similar circuit components to, those in the CAM array) that performs a compare operation with a pre-stored comparand such that the comparison always generates a mis-match (e.g., as a signal on output 1002). Select circuit 1005 compares or combines the timing or logic states to select the slowest results reflected on lines 1002 and 1004.

For one embodiment, each of the comparison result signals is an active high signal that is asserted to the active high state when the respective timing circuit has completed its compare function(s). For this embodiment, select circuit 1005 may be a logic AND gate.

Two compare timing circuits 1001 and 1006 are included in dynamic timing generator 1020 because either a match or mis-match comparison result for a given row of CAM cells in the CAM array may take longer. If, either a match or mis-match will always take longer, than only one such comparison timing generator circuit need be included in dynamic timing circuit 1020. Alternatively, if a row of CAM cells in the CAM array can have more than one state, then additional timing circuits may be included in dynamic timing generator 1020, one for each possible output state of the rows of CAM cells of the CAM array.

Note that match comparison timing circuit 1001 can determine the worst-case time that it would take for a match comparison operation to take place in any row of CAM array 240. This may be accomplished, for example, by performing a series of comparison operations to precondition output line 1002 to a particular state before generating a match condition. Exemplary embodiments will be described below. Similarly, mis-match comparison timing circuit 1006 can determine the worst-case time that it would take for a mis-match comparison operation to take place in any row of CAM array 240. This may be accomplished, for example, by performing a series of comparison operations to precondition output line 1004 to a particular state before generating a mis-match condition. Exemplary embodiments will be described below.

Thus, dynamic timing generator 1020 may be tailored so as to test against both a worst case match comparison condition and a worst case mis-match comparison condition. In this sense, the design approach of FIG. 10 is comprehensive because a plurality of potential worst case circumstances are individually measured or determined, and the worst result across the plurality of worst case circumstances is used to set the CAM's latch time. As such, the probability of a race condition occurring is low because the latch time is set at or beyond what is believed to be the slowest possible CAM comparison time.

Note that since timing circuits 1001 and 1006 perform the same functions as the rows of CAM cells in CAM array 204, that as operating conditions change the comparison results generated by timing circuits 1001 and 1006 adjust in a similar manner (e.g., by a similar or proportional amount of time, voltage, etc.) as the match results generated by CAM array 240. When the timing circuits 1001 and 1006 are formed using similar circuits and geometries (e.g., also use rows of similarly designed CAM cells or compare circuits to those used in CAM array 240), changes in operating conditions substantially affect both the CAM array and the timing circuits in substantially the same way, thus allowing the benefits of on-chip latch time determination to dynamically track with changes in operating conditions.

Figure 11:
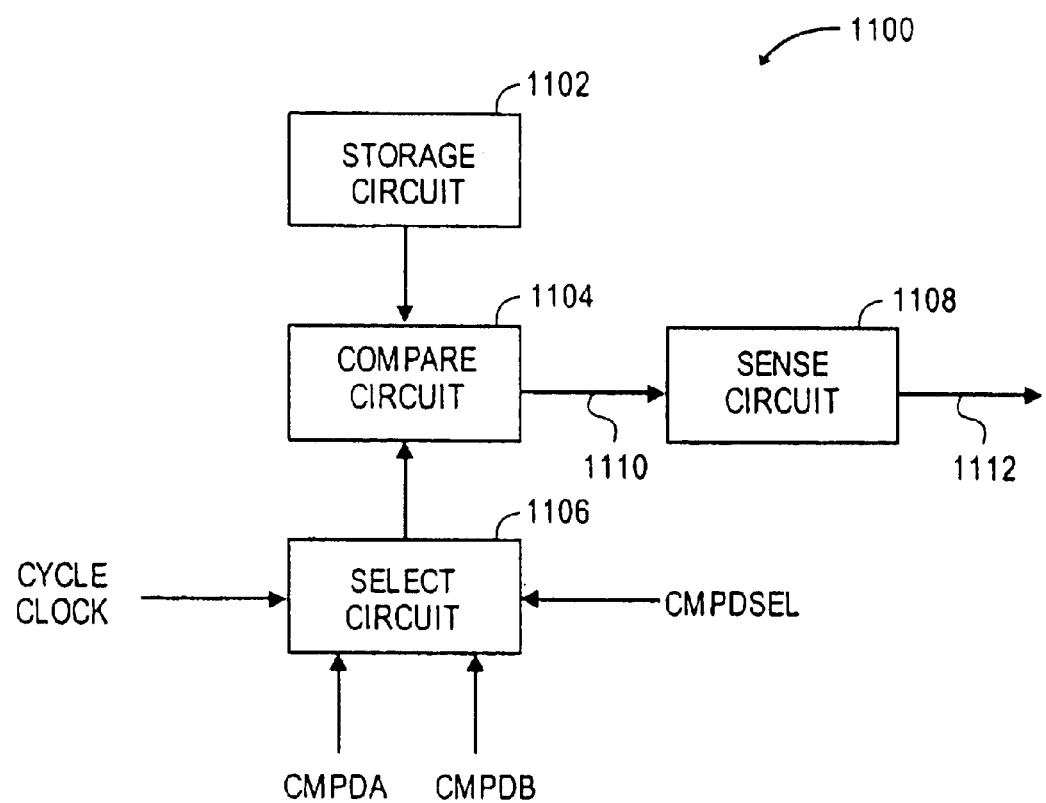
FIG. 11 shows an embodiment of the match or mis-match comparison timing circuits of FIG. 10.

FIG. 11 illustrates comparison timing circuit 1100 that is one embodiment of the timing circuits 1001 and 1006 of FIG. 10. Comparison timing circuit 1100 includes storage circuit 1102, compare circuit 1104, select circuit 1106, and sense circuit 1108. Compare circuit 1104 compares the data stored in storage circuit 1102 with either comparand A (CMPDA) or comparand B (CMPDB) provided by select circuit 1106. CMPDA and CMPDB may be stored in storage circuits or may be provided external to the CAM architecture.

Select circuit 1106 determines which comparand to supply to compare circuit 1104 in response to the comparand select signal CMPDSEL. CMPDSEL may be generated, for example, by a control circuit or instruction decoder, a timing circuit, or may be free running. Select circuit provides its output to the compare circuit also in response to the cycle clock. For one embodiment, select circuit 1106 is a multiplexer. The result of the comparison operation performed by compare circuit 1104 is provided on signal line 1110 and sensed by sensing circuit 1108. Sensing circuit 1108 senses the voltage change of the comparison result on signal line 1110 and detects when the voltage has reached one or more thresholds. Sensing circuit 1108 then asserts or deasserts a signal on signal line 1112. Sensing circuit 1108 may be any type of sensing circuit including a single or differential sense amplifier, a logic gate (e.g., an inverter, AND gate, OR gate, etc.) and the like. The sensed output is provided to signal line 1112 that corresponds to comparison result outputs 1002 and 1004 of FIG. 10.

For one embodiment, storage circuit 1102 and compare circuit 1104 form a row of CAM cells (e.g., such as that shown in FIG. 3 or 6), and signal line 1110 corresponds to a match line. To mirror and parallel the operation of the rows of CAM cells in the CAM array 240 of FIG. 2, the row of CAM cells formed by storage circuit 1102 and compare circuit 1104 are manufactured in a similar manner to, and include substantially similar circuit components to, those in the CAM array.

Note that some form of deliberate additional delay may be added to the output of comparison timing circuit 1100 (e.g., via the propagation of one or more logic gates) to ensure that a latch time which is derived from the result is beyond the comparison times of the individual rows of CAM cells in CAM array 240. By so doing, race conditions can be avoided.

For alternative embodiments, data stored in storage circuit 1102 may be hardwired to particular logic states (i.e., not stored in memory circuits such as those found in CAM array 240) to reduce the size of storage circuit. This can be accomplished while still maintaining substantially similar responses between the comparison timing circuit 1100 and the rows of CAM cells in CAM array 240 during compare operations across varying operating conditions.

In still other embodiments, storage circuit 1102 and compare circuit 1104 may be replaced by a circuit whose timing characteristics (e.g., its RC time constant) are designed to correlate to the comparison timing characteristics of the rows of CAM cells in CAM array 240 (i.e., substantially tracks the voltage changes on the match lines of the CAM array in response to changes in operating conditions). Because of the design for correlation, the output from such a comparison timing circuit can still be used to set the CAM's latch time even if a comparison is not actually performed by the timing circuit. Again, those of ordinary skill will be able to determine the appropriate correlation and/or any additional delay to avoid race conditions.

Figure 12:
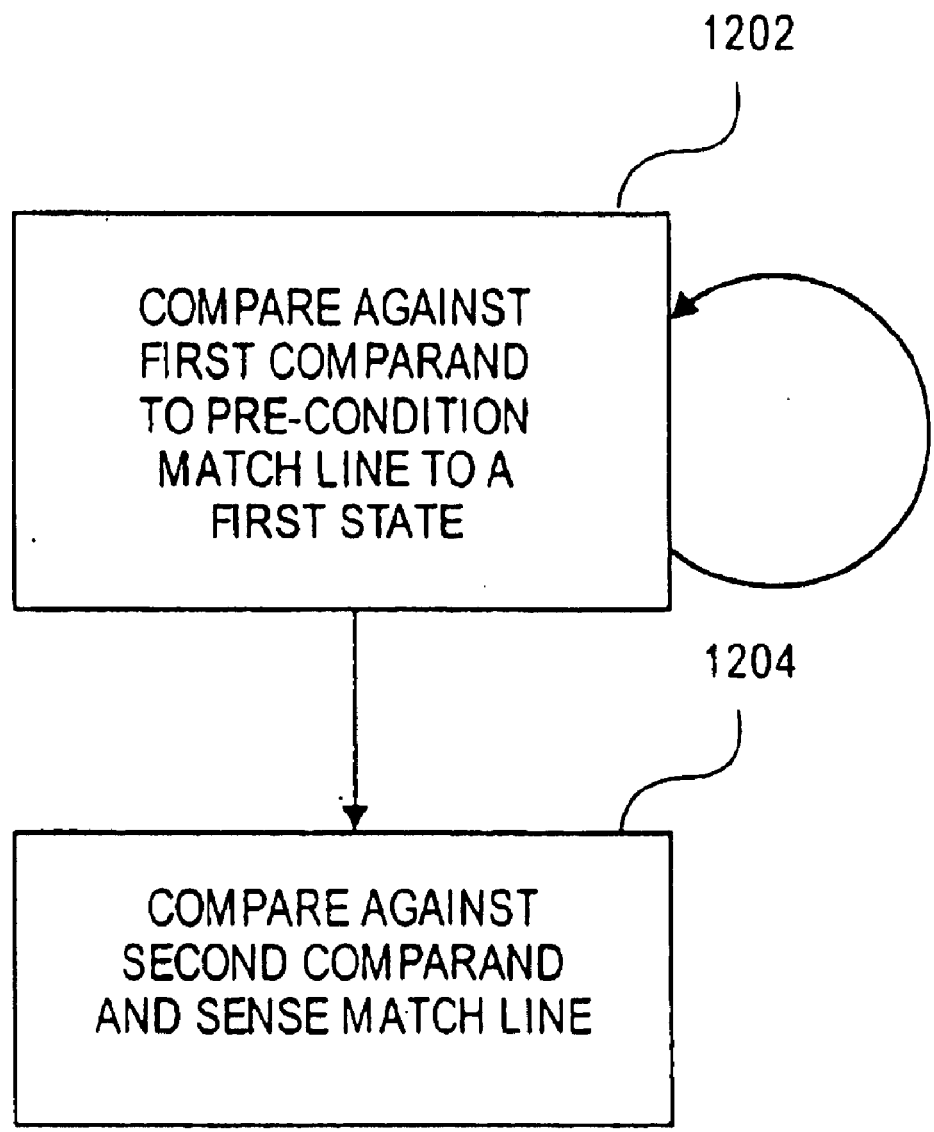
FIG. 12 shows an embodiment of the operation of the comparison timing circuit of FIG. 11.

The operation of comparison timing circuit 1100 is further illustrated in FIG. 12. At 1202, CMPDSEL is in a first state such that select circuit 1106 provides CMPDA to compare circuit 1104. Compare circuit 1104 compares CMPDA with the data stored in storage circuit 1102 as many times as is required to pre-condition the signal line 1110 to a first state. Subsequently, at 1204, CPMDSEL transitions to a second state such that select circuit 1106 provides CMPDB to compare circuit 1106. Compare circuit 1106 compares CMPDB with the data stored in storage circuit 1102, and sense circuit 1108 senses when the voltage on signal line 1110 has reached one or more thresholds.

Consider when comparison timing circuit 1100 is operating as a match comparison timing circuit such as 1001 of FIG. 10. Comparison timing circuit 1100 determines the worst-case (i.e., slowest) comparison time of any row of CAM cells in CAM array 240 to determine a match condition under current operating conditions by having CMPDA set to mis-match the data stored in storage circuit 1102 and CMPDB set to match the data stored in storage circuit 1102. For example, when CMPDA mis-matches the data stored in storage circuit 1102 (at 1202), the voltage on signal line 1110 will be discharged towards ground potential (for a NOR-based row of CAM cells). This may take one or more clock cycles to discharge signal line 1110 as close to ground potential as possible, but can be more quickly achieved by having CMPDA mis-match all bits of the data stored in storage circuit 1102. Then, CMPDB is provided at 1204 and sensing circuit 1108 senses when the signal on signal line 1110 is equal to or greater than VTH (e.g., as shown in FIG. 4). Note that this example has been discussed with reference to NOR-based CAM cell operation, but can be readily adapted to NAND-based CAM cell operation.

Now consider when comparison timing circuit 1100 is operating as a mis-match comparison timing circuit such as 1006 of FIG. 10. Comparison timing circuit 1100 determines the worst-case (i.e., slowest) comparison time of any row of CAM cells in CAM array 240 to determine a mis-match condition under current operating conditions by having CMPDA set to match the data stored in storage circuit 1102 and CMPDB set to mis-match the data stored in storage circuit 1102. For example, when CMPDA matches the data stored in storage circuit 1102 (at 1202), the voltage on signal line 1110 will be charged towards the power supply rail VDD (for a NOR-based row of CAM cells). This may take one or more clock cycles to charge signal line 1110 as close to VDD as possible. Then, CMPDB is provided at 1204 and sensing circuit 1108 senses when the signal on signal line 1110 is equal to or less than VTH (e.g., as shown in FIG. 4). The worst case mis-match pattern (i.e., the one that will cause the signal on signal line 1110 to take the longest time to discharge towards VTH and ground) is when only a single-bit of CMPDB mis-matches a corresponding single bit in the data stored in storage circuit 1002 because only a single CAM cell will be discharging signal line 1110. So, the worst-case mis-match pattern may be used to more closely parallel worst-case mis-match operations that may take place in any row of CAM cells in CAM array 240. Note that this example has been discussed with reference to NOR-based CAM cell operation, but can be readily adapted to NAND-based CAM cell operation.

Figure 13:
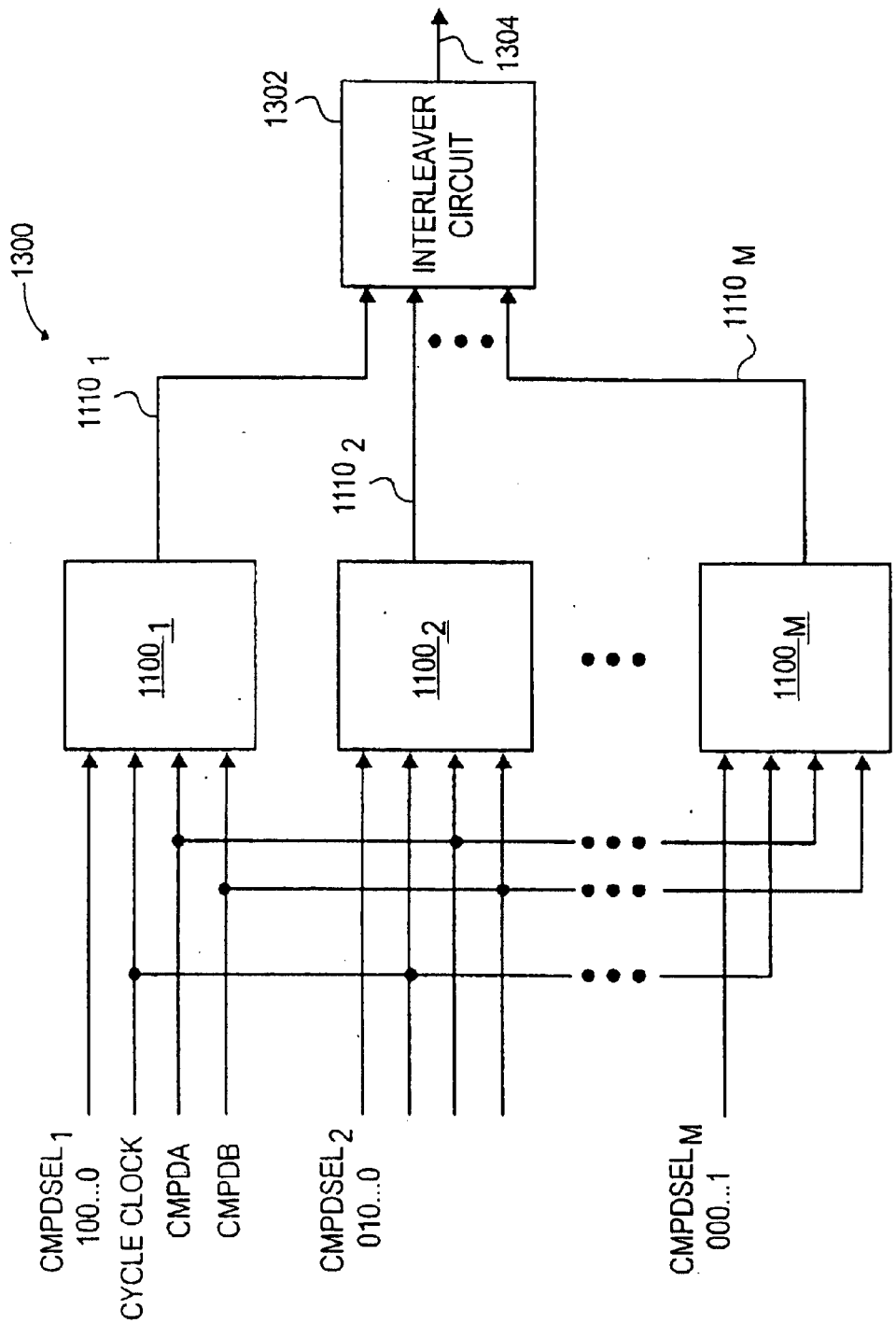
FIG. 13 shows another embodiment of the match or mis-match comparison timing circuits of FIG. 10.

Note that comparison timing circuit 1100 of FIG. 11 generates a compare results on signal line 1110 and 1112 every cycle clock. However, it generates a worst-case match or mis-match compare result at a frequency less than every cycle clock. FIG. 13 illustrates a comparison timing circuit 1300 that is another embodiment of either of timing circuits 1001 or 1006 of FIG. 10. Comparison timing circuit 1300 includes interleaver circuit 1302 and M comparison timing circuits 1100 as shown in FIG. 11, where M is any number. Each of the comparison timing circuits generates a worst-case match or mis-match comparison result as described above, except that the CMPDSEL signal for the respective comparison timing circuits 1100 are each set to a logic one state once every M clock cycles, and each CMPDSEL is set to a logic one state in a different clock cycle such that for any given cycle of the cycle clock, one of the circuits 1000 is outputting a worst-case match or mis-match comparison result (depending on whether it is configured to operate as 1001 or 1006 of FIG. 10). Interleaver circuit 1302 combines the outputs of the timing circuits 1100, and provides the combined output to signal line 1304 that corresponds to outputs 1002 or 1004 of FIG. 10. For one embodiment, interleaver circuit 1302 is an OR logic gate. For other embodiments, interleaver circuit 1302 may be one or more other logic gates or circuits.

Figure 14:
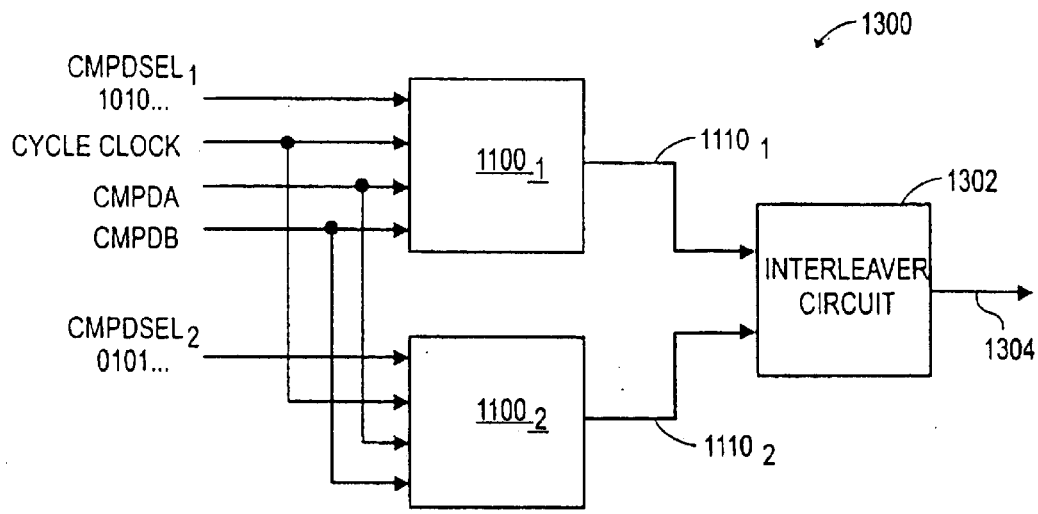
FIG. 14 shows another embodiment of the match or mis-match comparison timing circuits of FIG. 10.

FIG. 14 illustrates the operation of comparison timing generator 1300 of FIG. 13 using two comparison timing generator circuits 1100. Consider, for this example, that comparison timing circuit 1300 operates as match comparison timing generator circuit 1001 of FIG. 10. In a first cycle of the cycle clock, $CMPDSEL_1$ is set to a logic one state to select CMPDA which has all of its bits set to mis-match the data stored in each of the storage circuits in the timing circuits, and $CMPDSEL_2$ is set to a logic zero state to select CMPDB which has all of its bits set to match the data stored each of the storage circuits in the timing circuits. In the following second cycle of the cycle clock, $CMPDSEL_1$ is set to a logic zero state to select CMPDB and $CMPDSEL_2$ is set to a logic one state to select CMPDA, and the sense circuit of timing circuit $1100_1$ asserts the signal on signal line $1110_1$ when a match is detected (and deasserts the signal on signal line $1110_1$ before the next match result is determined by $1100_2$). In the following third cycle of the cycle clock, $CMPDSEL_1$ is again set to a logic one state to select CMPDA, and $CMPDSEL_2$ is again set to a logic one state to select CMPDB, and the sense circuit of timing circuit $1100_2$ asserts the signal on signal line $1110_2$ when a match is detected (and deasserts the signal on signal line $1110_2$ before the next match result is determined by $1100_1$). In this manner, comparison timing circuit 1300 of FIG. 14 outputs a worst-case match comparison timing signal on signal line 1304 every cycle of the cycle clock for use in latching match results from CAM array 240 of FIG. 2.

Similarly, consider another example in which comparison timing circuit 1300 of FIG. 13 operates as match comparison timing generator circuit 1006 of FIG. 10. In a first cycle of the cycle clock, $CMPDSEL_1$ is set to a logic one state to select CMPDA which has all of its bits set to match the data stored in each of the storage circuits in the timing circuits 1100, and $CMPDSEL_2$ is set to a logic zero state to select CMPDB which has, for example, one of its bits set to mis-match a corresponding data bit stored in each of the storage circuits in the timing circuits. In the following second cycle of the cycle clock, $CMPDSEL_1$ is set to a logic zero state to select CMPDB and $CMPDSEL_2$ is set to a logic one state to select CMPDA, and the sense circuit of timing circuit $1100_1$ asserts the signal on signal line $1110_1$ when a mis-match is detected (and deasserts the signal on signal line $1110_1$ before the next mis-match result is determined by $1100_2$). In the following third cycle of the cycle clock, $CMPDSEL_1$ is again set to a logic one state to select CMPDA, and $CMPDSEL_2$ is again set to a logic one state to select CMPDB, and the sense circuit of timing circuit $1100_2$ asserts the signal on signal line $1110_2$ when a mis-match is detected (and deasserts the signal on signal line $1110_2$ before the next mis-match result is determined by $1100_1$). In this manner, comparison timing circuit 1300 of FIG. 14 outputs a worst-case mis-match comparison timing signal on signal line 1304 every cycle of the cycle clock for use in latching match results from CAM array 240 of FIG. 2.

Figure 15:
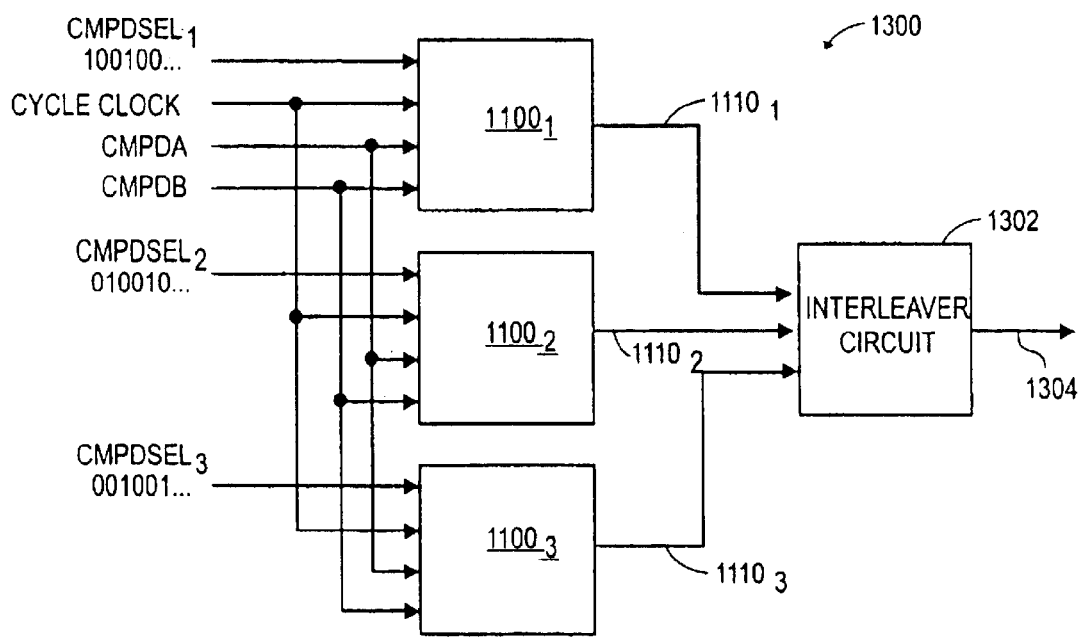
FIG. 15 shows another embodiment of the match or mis-match comparison timing circuits of FIG. 10.

FIG. 15 illustrates the operation of comparison timing generator 1300 of FIG. 13 using three comparison timing generator circuits 1100. Consider, for this example, that comparison timing circuit 1300 operates as match comparison timing generator circuit 1001 of FIG. 10. In a first cycle of the cycle clock, $CMPDSEL_1$ and $CMPDSEL_2$ are each set to a logic zero state to select CMPDA which has all of its bits set to mis-match the data stored in each of the storage circuits in the timing circuits 1100, and $CMPDSEL_3$ is set to a logic zero state to select CMPDB which has all of its bits set to match the data stored in each of the storage circuits in the timing circuits. In the following second cycle of the cycle clock, $CMPDSEL_2$ and $CMPDSEL_3$ are each set to a logic zero state to select CMPDB, and $CMPDSEL_1$ is set to a logic one state to select CMPDA, and the sense circuit of timing circuit $1100_1$ asserts the signal on signal line $1110_1$ when a match is detected (and deasserts the signal on signal line $1110_1$ before the next match result is determined by $1100_2$). In the following third cycle of the cycle clock, $CMPDSEL_1$ and $CMPDSEL_3$ are each set to a logic zero state to select CMPDB, and $CMPDSEL_2$ is set to a logic one state to select CMPDA, and the sense circuit of timing circuit $1100_2$ asserts the signal on signal line $1110_2$ when a match is detected (and deasserts the signal on signal line $1110_2$ before the next match result is determined by $1100_3$). In the following fourth cycle of the cycle clock, $CMPDSEL_1$ and $CMPDSEL_2$ are each again set to a logic zero state to select CMPDB, and $CMPDSEL_3$ is again set to a logic one state to select CMPDA, and the sense circuit of timing circuit $1100_3$ asserts the signal on signal line $1110_3$ when a match is detected (and deasserts the signal on signal line $1110_3$ before the next match result is determined by $1100_1$). In this manner, comparison timing circuit 1300 of FIG. 15 outputs a worst-case match comparison timing signal on signal line 1304 every cycle of the cycle clock for use in latching match results from CAM array 240 of FIG. 2.

FIG. 15 illustrates the operation of comparison timing generator 1300 of FIG. 13 using three comparison timing generator circuits 1100. Consider, for this example, that comparison timing circuit 1300 operates as a mis-match comparison timing generator circuit 1006 of FIG. 10. In a first cycle of the cycle clock, $CMPDSEL_1$ and $CMPDSEL_2$ are each set to a logic one state to select CMPDA which has all of its bits set to match the data stored in each of the storage circuits in the timing circuits 1100, and $CMPDSEL_3$ is set to a logic zero state to select CMPDB which has, for example, a single one of its bits set to mis-match a corresponding data bit stored in each of the storage circuits in the timing circuits. In the following second cycle of the cycle clock, $CMPDSEL_2$ and $CMPDSEL_3$ are each set to a logic zero state to select CMPDB, and $CMPDSEL_1$ is set to a logic one state to select CMPDA, and the sense circuit of timing circuit $1100_1$ asserts the signal on signal line $1110_1$ when a mis-match is detected (and deasserts the signal on signal line $1110_1$ before the next mis-match result is determined by $1100_2$). In the following third cycle of the cycle clock, $CMPDSEL_1$ and $CMPDSEL_3$ are each set to a logic zero state to select CMPDB, and $CMPDSEL_2$ is set to a logic one state to select CMPDA, and the sense circuit of timing circuit $1100_2$ asserts the signal on signal line $1110_2$ when a mis-match is detected (and deasserts the signal on signal line $1110_2$ before the next mis-match result is determined by $1100_3$). In the following fourth cycle of the cycle clock, $CMPDSEL_1$ and $CMPDSEL_2$ are each again set to a logic zero state to select CMPDB, and $CMPDSEL_3$ is again set to a logic one state to select CMPDA, and the sense circuit of timing circuit $1100_3$ asserts the signal on signal line $1110_3$ when a mis-match is detected (and deasserts the signal on signal line $1110_3$ before the next mis-match result is determined by $1100_1$). In this manner, comparison timing circuit 1300 of FIG. 15 outputs a worst-case mis-match comparison timing signal on signal line 1304 every cycle of the cycle clock for use in latching match results from CAM array 240 of FIG. 2.

Note that the match comparison timing circuit 1001 and the mis-match comparison timing circuit 1006 of FIG. 10 may each have a different number of timing circuits 1100. For example, the match comparison timing circuit may have two timing circuits such as shown in FIG. 14, and the mis-match comparison timing circuit may have three timing circuits such as shown in FIG. 15.

FIG. 16 shows 16CAM apparatus or device 1600 that is one embodiment of a CAM device that includes CAM architecture 200 of FIG. 2. The CAM apparatus may be formed, for example, as an integrated circuit on a semiconductor substrate.

CAM device 1600 includes addressing unit 1610 that is capable of addressing one or more rows of CAM cells in CAM array 240 (or one or more individual CAM cells). Addressing unit 1610 may include, for example, a decoder that is coupled to word lines in the CAM array. The addresses are provided along an address bus 1617.

The Read/Write unit 1611 is capable of reading and writing data words from/to one or more rows of CAM cells (or one or more individual CAM cells) in CAM array 240. For example, Read/Write unit 1611 may include one or more sense amplifiers for sensing and amplifying data stored in CAM array 240 during a read operation, and one or more write drivers for driving data to one or more rows and/or cells in CAM array 240. The data words are provided along a data bus 1618. An instruction decoder unit 1619 interprets instructions (e.g., write, read, compare) that are presented along an instruction bus 1621. The instruction decoder unit 1619 can also control the timing of any read, write or compare operations. If comparands used by the dynamic timing generator 220 are held by registers (not shown) associated with the dynamic timing generator 220, these comparands may be written/read to/from their registers via, for example, the data bus 1618. Here, the instruction decoder 1619 may be tailored to access these registers. Additionally, instruction decoder may provide one or more control signals or timing signals to one or more of the other circuit blocks including provide CMPDSEL signals to dynamic timing generator 220.

Note that one or more of the address bus, data bus, instruction bus or bus carrying the comparand data may time multiplexed onto one or more of the other buses.

CAM array 240 may also be formed from several CAM array blocks each having their own address space as a subset of the entire address space for the CAM device. CAM arrays are conventionally blocked out to reduce signal line RC delays and speed the operation of the device. Here, each CAM array block may have its own dedicated dynamic timing generator, or may share a dynamic timing generator with one of the other CAM array blocks.

Figure 17:
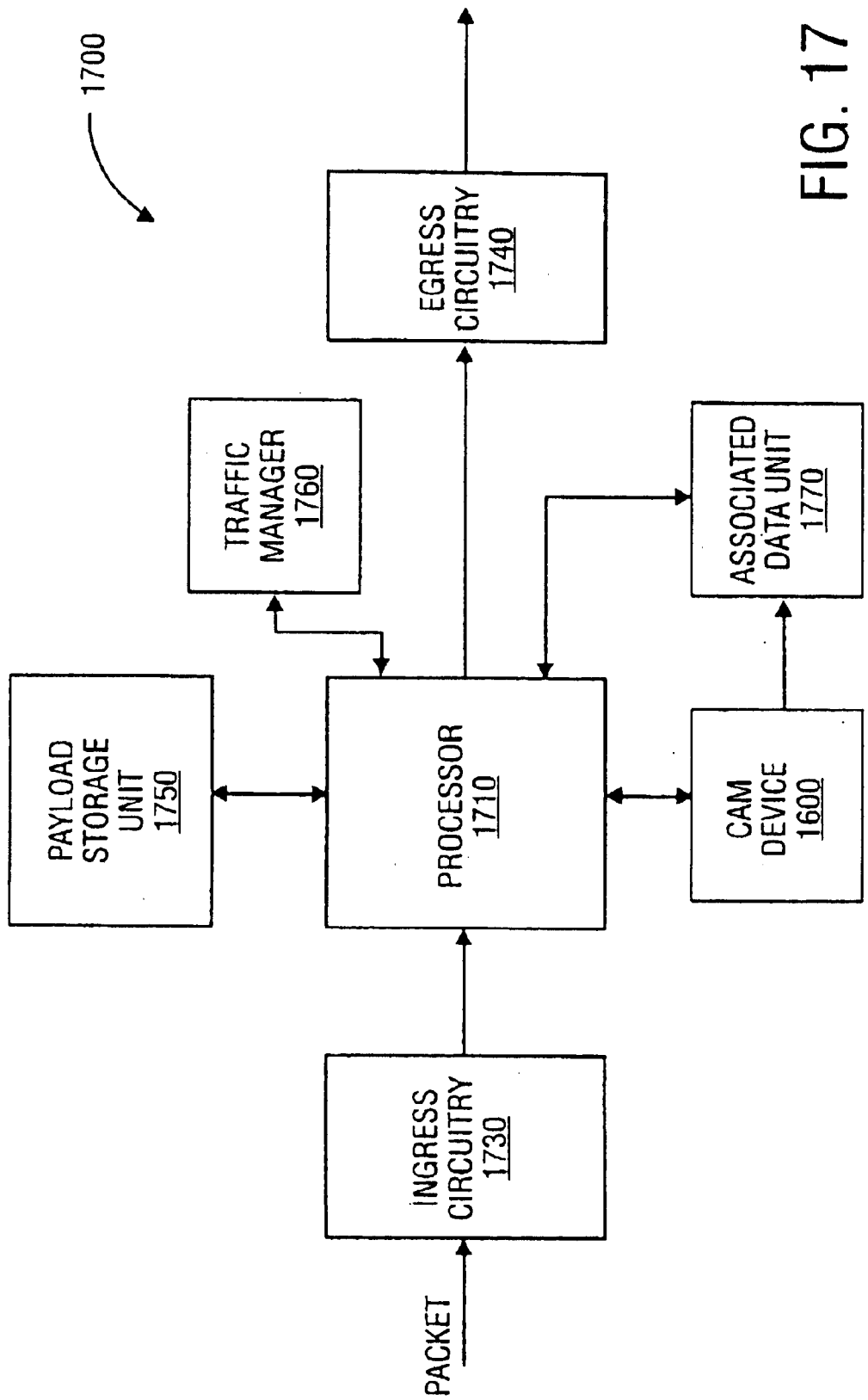
FIG. 17 shows an embodiment of an application that includes the CAM device of FIG. 16.

FIG. 17 illustrates one embodiment 1700 of an application (e.g., a networking application such as a switching card for a switch, a routing card for a router, or a line card for either or both a switch and/or a router) that can perform a look-up by using CAM device 1600 of FIG. 16. A card is board-like structure having a plurality of semiconductor chips and the interconnections between them. Typically, the semiconductor chips are mounted to the card (e.g., by being soldered to the card or by being "plugged into" a socket that has been soldered to the card). The card embodiment of FIG. 17 includes a processor 1710, ingress circuitry 1730, egress circuitry 1740, CAM 1600, associated data storage unit 1770, traffic manager 1760, and payload storage unit 1750.

Processor 1710 functions to control the overall operation of the application. For example, processor 1710 receives packets from a network medium through ingress circuitry 1730, stores the payload of packets in payload storage unit 1750, and processes packet header information to determine look-ups in CAM device 1600 and subsequent handling of the packets, as discussed herein. Ingress circuitry includes, for example, PHY and MAC devices. Processor 1710 sends out packets on a network medium through egress interface circuitry 1740 based on the lookups performed by CAM device 1600. Egress interface circuitry 1740 may be connected to a switch fabric or directly to one or more other routers or switches. Processor 1710 may be one or more network processor units (NPUs), microprocessors, or one or more special purpose processors such as a digital signal processor (DSP). In another embodiment, processor 1710 may be another type of controller, for example, a field programmable gate array or a general purpose processor. The processor 1710, ingress interface circuitry 1730, and egress interface circuitry 1740 components of a router are known in the art; accordingly, a detailed discussion is not provided.

In response to information in a packet header, for a particular packet, processor 1710 determines the number and types of lookups to be performed by one or more of CAM devices 1600, and forms the search keys for these lookups. The searches or lookups may include, for example, Classification lookups, forwarding lookups (e.g., Next Hop or longest prefix match (LPM) lookup, MAC lookup, MPLS lookup, etc.) When multiple searches are required, processor 1710 may form a composite search key that includes at least two, and as many as all, of the various search keys for the lookups. The composite search key may then be provided as a common input string to CAM device 1600. CAM device 1600 may selectively identify and extracts the individual search keys from the common input string and provides the individual search keys to associated CAM array blocks in CAM device 1600 to perform the lookups. Advantageously, the lookups can then occur concurrently or simultaneously in the CAM array blocks of CAM device 1600, thereby increasing overall throughput over conventional systems in which searches are processed sequentially.

CAM device 1600 may be a multiple block CAM device with each block capable of storing a different table for comparand lookups. Alternatively, CAM device 1600 may represent multiple, single block CAM devices (e.g., with each single block CAM device formed on a different integrated circuit substrate) with each CAM device used to store a different table for comparand lookup. After one or more lookups are executed in CAM device 1600, associated information for matching entries (e.g., additional routing information and/or packet information) may be retrieved from associated data unit 1770. Processor 1710 then communicates with traffic manager 1760 to schedule the exit of a packet line card 1700 via egress interface circuitry 1740.

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a circuit description formatted in the VHSIC Hardware Description Language (VHDL) language, Verilog language or SPICE language. Some circuit description examples include: a behavioral level description, a register transfer level (RTL) description, a gate level netlist and a transistor level netlist. Machine readable media may also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As described above, dynamic timing generator 220 includes or is associated with circuitry that performs compare operations that parallel the operation of CAM array 240 to generate a comparison timing signal that indicates the worst-case match and/or mismatch condition for CAM array 240. The comparison timing signal is used to trigger assertion of the latch enable signal, which in turn causes latch circuits $202_1$–$202_k$ to capture the match results generated by corresponding rows of CAM cells $240_1$–$240_k$. Thus, as the generation of match results is increased or decreased in time by the operation of the CAM array 240 under various operating conditions, dynamic timing generator 220 similarly and proportionally dynamically adjusts the assertion of the latch enable signal so that the match results are captured as soon as they are stable on the match lines. In this manner, performance of CAM architecture 200 is dynamically optimized under various operating conditions.

In additional embodiments described below, additional consideration is given to the propagation delay of comparand data as it is transmitted from comparand register 208 to the rows of CAM cells 240 relative to the propagation delay of the latch enable signal as it is transmitted from dynamic timing generator 220 to latch circuits $201_1$–$202_k$ via the latch enable signal line 203.

Figure 18:
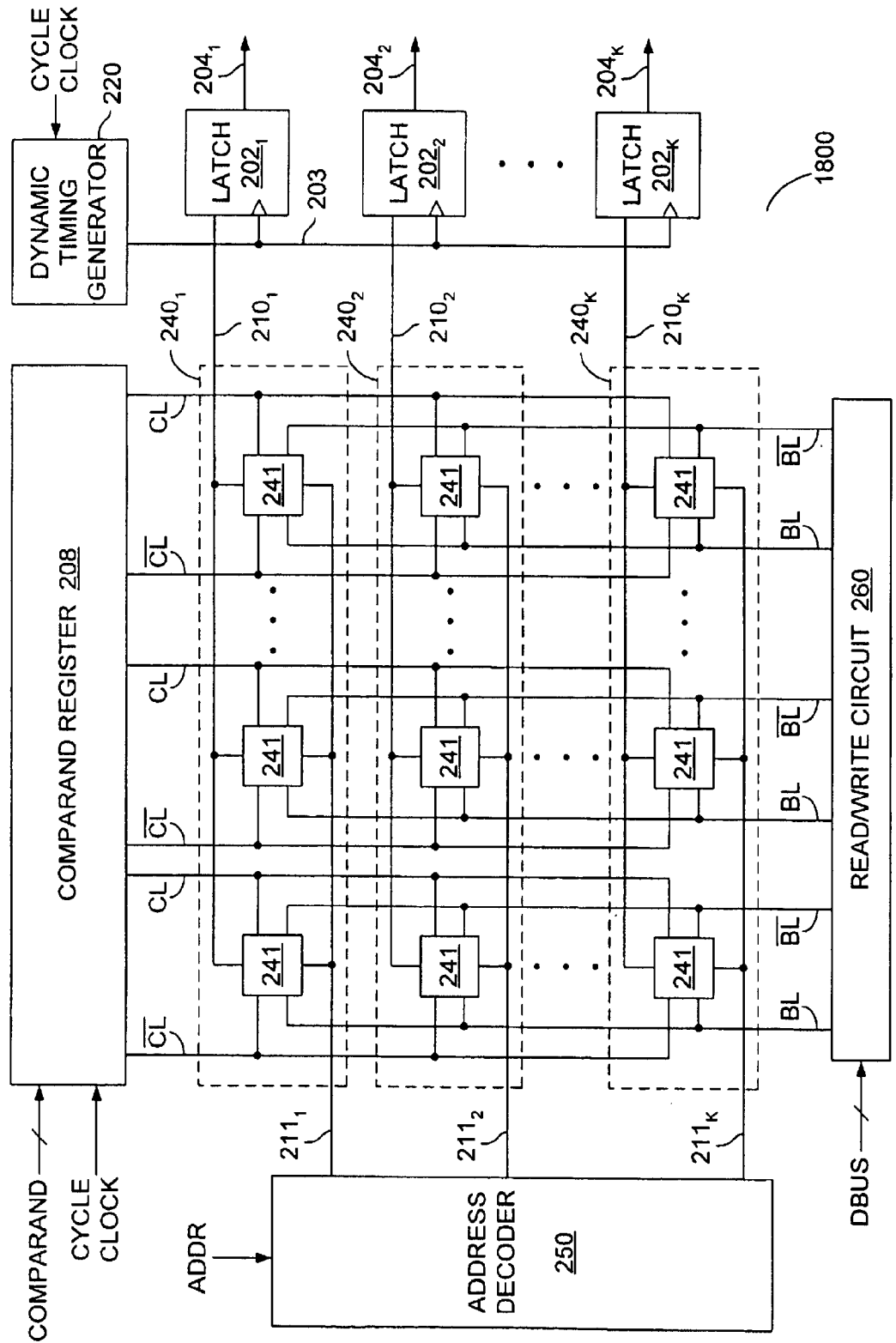
FIG. 18 shows a more detailed configuration of one embodiment of the CAM architecture of FIG. 2.

FIG. 18 shows a more detailed configuration 1800 of one embodiment of CAM architecture 200 of FIG. 2. CAM architecture 1800 includes k rows of CAM cells $240_1$–$240_k$, each coupled to a corresponding match line $210_1$–$210_k$ and to a corresponding word line $211_1$–$211_k$. The CAM cells may be any type of CAM cell including binary, ternary, or quaternary CAM cells having one or more storage elements and one or more compare circuits. The word lines are driven by a well-known address decoder 250 in response to an address ADDR, which can be provided by an address bus, as a next free address (NFA) by priority encoder 250, or by another suitable circuit. In some embodiments, multiple word lines may be used for each row of CAM cells. Match lines $210_1$–$210_k$ are coupled to the data inputs of corresponding latch circuits $202_1$–$202_k$, each of which includes an enable input to receive the latch enable signal from dynamic timing generator 220 via signal line 203, and includes an output to provide a latched match signal on a corresponding signal line $204_1$–$204_k$ to, for example, priority encoder 205. In some embodiments, multiple match lines and multiple latch circuits may be used for each row of CAM cells.

Each column of CAM cells 241 is coupled to a pair of bit lines BL and $\overline{BL}$ and a pair of comparand signal lines CL and $\overline{CL}$. The bit lines BL and $\overline{BL}$ carry complementary data to/from the CAM cells 241 and are coupled to a read/write circuit 260, which includes well-known sense amplifies and write drivers to facilitate read and write operations to CAM cells 241. Read/write circuit 260 is coupled to an optional data bus DBUS. In alternative embodiments, only a single bit line may be used to communicate data with the CAM cells 241. The comparand lines CL and $\overline{CL}$ communicate complementary comparand data stored in comparand register 208 with the CAM cells 241. In alternative embodiments, only a single comparand line may be used to communicate comparand data with the CAM cells 241 or one or more of the comparand signals may be shared on one or more of the bit lines.

During compare operations, comparand register 208 transmits comparand data to columns of CAM cells 241 via corresponding comparand lines CL and $\overline{CL}$, and dynamic timing generator 220 transmits the latch enable signal to latch circuits $202_1$–$202_k$ via latch enable signal line 203 as described above. Because of propagation delays associated with CL and $\overline{CL}$, each row of CAM cells 240 receives the comparand data slightly later than the previous row and slightly before the next row. As a result, rows of CAM cells 240 positioned further from comparand register 208 commence compare operations later than rows of CAM cells 240 positioned closer to comparand register 208. Accordingly, because of propagation delays associated with CL and $\overline{CL}$, the match results for rows of CAM cells 240 positioned further from comparand register 208 generally become valid later than the match results for rows of CAM cells 240 positioned closer to comparand register 208. Similarly, because of propagation delays associated with signal line 203, latch circuits 202 positioned further from timing generator 220 receive the latch enable signal, and thus capture match results from corresponding match lines 210, later than latch circuits 202 positioned closer to timing generator 220.

If the comparand lines have different loading (e.g., resistance and capacitance of the signal line and circuits coupled thereto) than signal line 203 (e.g., because the circuits coupled to CL and $\overline{CL}$ are different than those coupled to signal line 203), then it is possible that the latch enable signal will cause one or more of the latch enable circuits to latch match results before valid match results are valid.

As indicated above, a delay circuit can be applied to the output of the dynamic timing generator to delay when the latch enable signal reaches the latches. Alternatively, the operation of dynamic timing generator 220 can be initially delayed for a given compare operation such that it generates its latch enable signal later in time than if it were not so initially delayed. For another embodiment, loading on latch enable signal line 203 can be modeled after the loading on comparand line pair CL/$\overline{CL}$ so that the propagation delay associated with transmitting comparand data to successive rows of CAM cells $240_1$–$240_k$ along CL/$\overline{CL}$ substantially matches or is less than the propagation delay associated with transmitting the latch enable signal to successive latch circuits $202_1$–$202_k$ along signal line 203.

Figure 19:
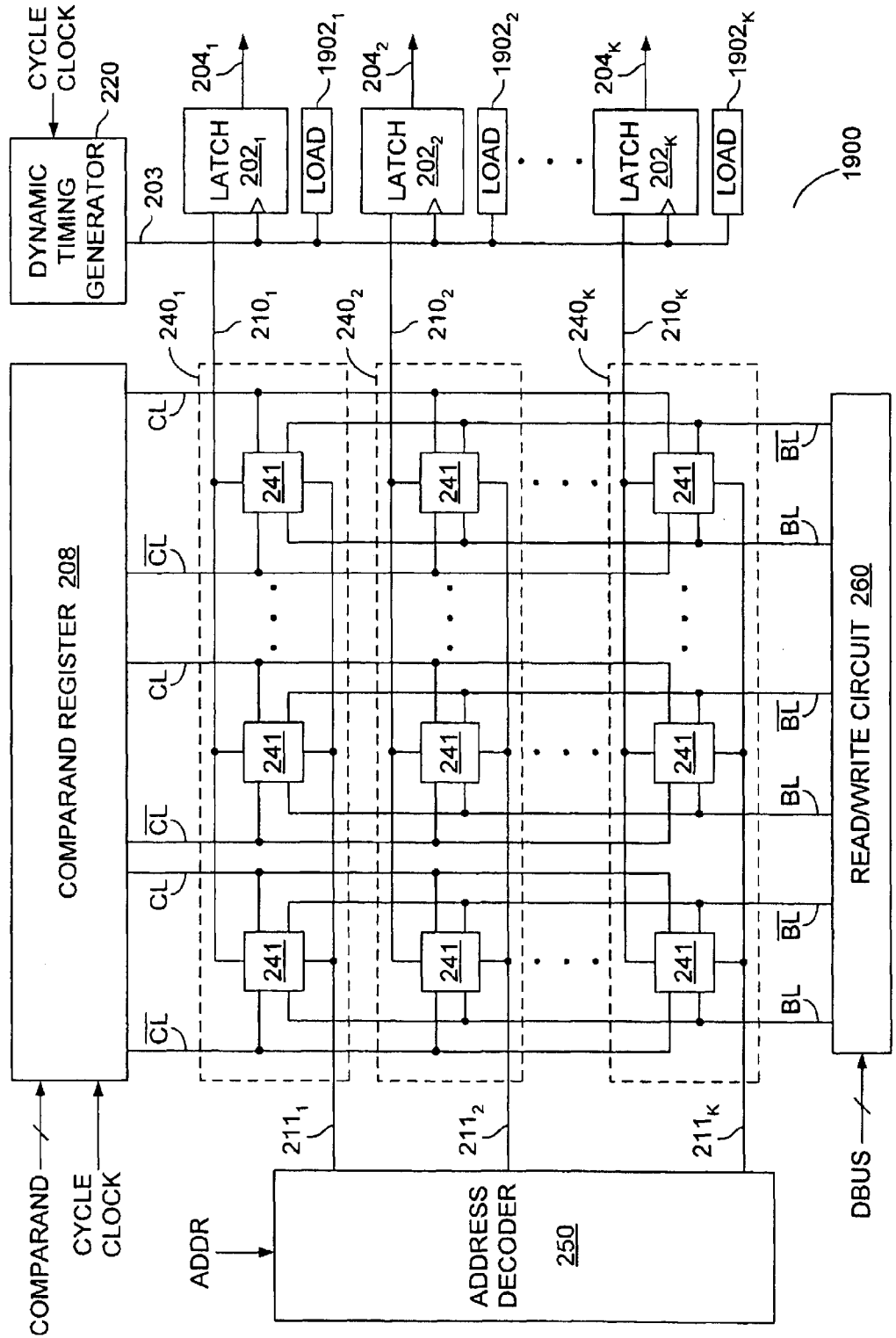
FIG. 19 shows another embodiment of a CAM architecture.

FIG. 19 shows a CAM architecture 1900 in accordance with one embodiment of the present invention. CAM architecture 1900 includes all the elements of CAM architecture 1800 of FIG. 18, with the addition of a plurality of load elements $1902_1$–$1902_k$ coupled to latch enable signal line 203. As shown in FIG. 19, there is one load element $1902_1$–$1902_k$ associated with each corresponding latch circuit $202_1$–$202_k$, however, for other embodiments, fewer load elements may be used. Load elements $1902_1$–$1902_k$, together with latch circuits $202_1$–$202_k$, model the load on the comparand lines such that the total load on latch enable signal line 203 is greater than or equal to that of the comparand lines. As a result, as match results become valid on match lines 210, the latch enable signal on signal line 203 will cause latches 202 to capture the correct match results for a given compare operation.

For example, if propagation delays associated with CL and $\overline{CL}$ result in the comparand data reaching the last row of CAM cells $240_k$ at a time t_delay after the comparand data reaches the first row of CAM cells $240_1$, then load elements $1902_1$–$1902_k$ can be configured to suitably load signal line 203 such that the asserted state (e.g., the rising edge) of the latch enable signal reaches the last latch circuit $202_k$ at least t_delay after it reaches the first latch circuit $202_1$. In one embodiment, load elements $1902_1$–$1902_k$ can be configured to suitably load signal line 203 such that the propagation delay on the comparand lines approximately equals the propagation delay on the latch enable signal line. In this manner, assertion of the latch enable signal can be timed to coincide with the match results for the first row of CAM cells $240_1$ becoming valid to optimize performance.

Although the embodiment of FIG. 19 is shown to include dynamic timing generator 220, for other embodiments of CAM architecture 1900, dynamic timing generator 220 can be replaced with a static timing generator such as, for example, timing generator 103 of FIG. 1 (e.g., a pulse circuit or a delay circuit).

Figure 20:
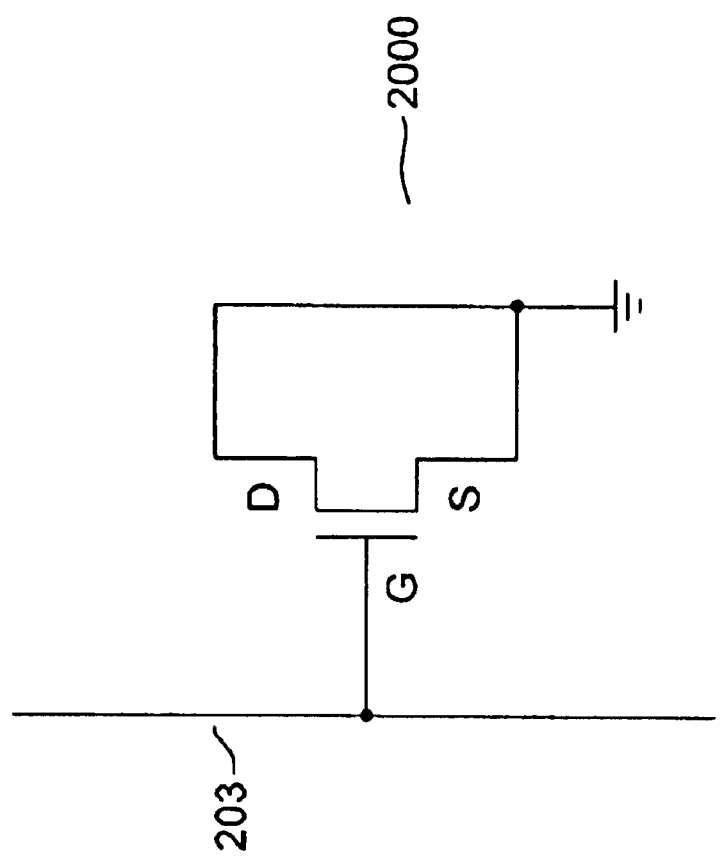
FIG. 20 shows one embodiment of a load element.

Load elements $1902_1$–$1902_k$ can be any suitable type of load circuit that increases the propagation delay associated with latch enable signal line 203. For some embodiments, each load element 1902 models the capacitive load on CL and $\overline{CL}$ resulting from the CAM cell 241 in a corresponding row of the CAM array. For example, each load circuit may be another CAM cell such as CAM cells 241, or only the portions of a CAM cell 241 that load the comparand signal line. FIG. 20 shows an NMOS transistor 2000 that is one embodiment of load elements 1902 of FIG. 19, although other suitable capacitive elements can be used. Transistor 2000, which has a gate (G) coupled to signal line 203 and its source (S) and drain (D) terminals coupled to ground, is configured as a capacitor that models the capacitive load on a comparand line pair CL and $\overline{CL}$ resulting from the CAM cell 240 in the corresponding row of CAM array. Thus, the capacitive load of transistor 2000 depends upon the configuration of the compare circuit used in CAM cells 240 and may either approximately model the capacitive load of the compare circuit or model such capacitive load in conjunction with the capacitive load provided by the corresponding latch 202. The gate capacitance of load transistor 2000 can be adjusted by manipulating its device geometries and characteristics (e.g., by manipulating its channel length/width, its gate oxide type and thickness, its doping concentration, and the like).

The embodiment of CAM architecture 1900 is illustrated in FIG. 19 and described above as having timing generator 220 located at the top of the array of CAM cells along with comparand register 208 such that the comparand data and the latch enable signal propagate in the same direction down the CAM array (e.g., from the first row of CAM cells $240_1$ to the last row of CAM cells $240_k$) during compare operations. As described above, for some embodiments, timing generator 220 can include one or more replica rows of CAM cells that model compare operations of CAM cell rows 240 to generate a comparison timing signal that triggers assertion of the latch enable signal. For other embodiments, dynamic timing generator 220 may be located on the opposite end of the CAM array from the comparand register, for example, as shown in FIG. 21.

Figure 21:
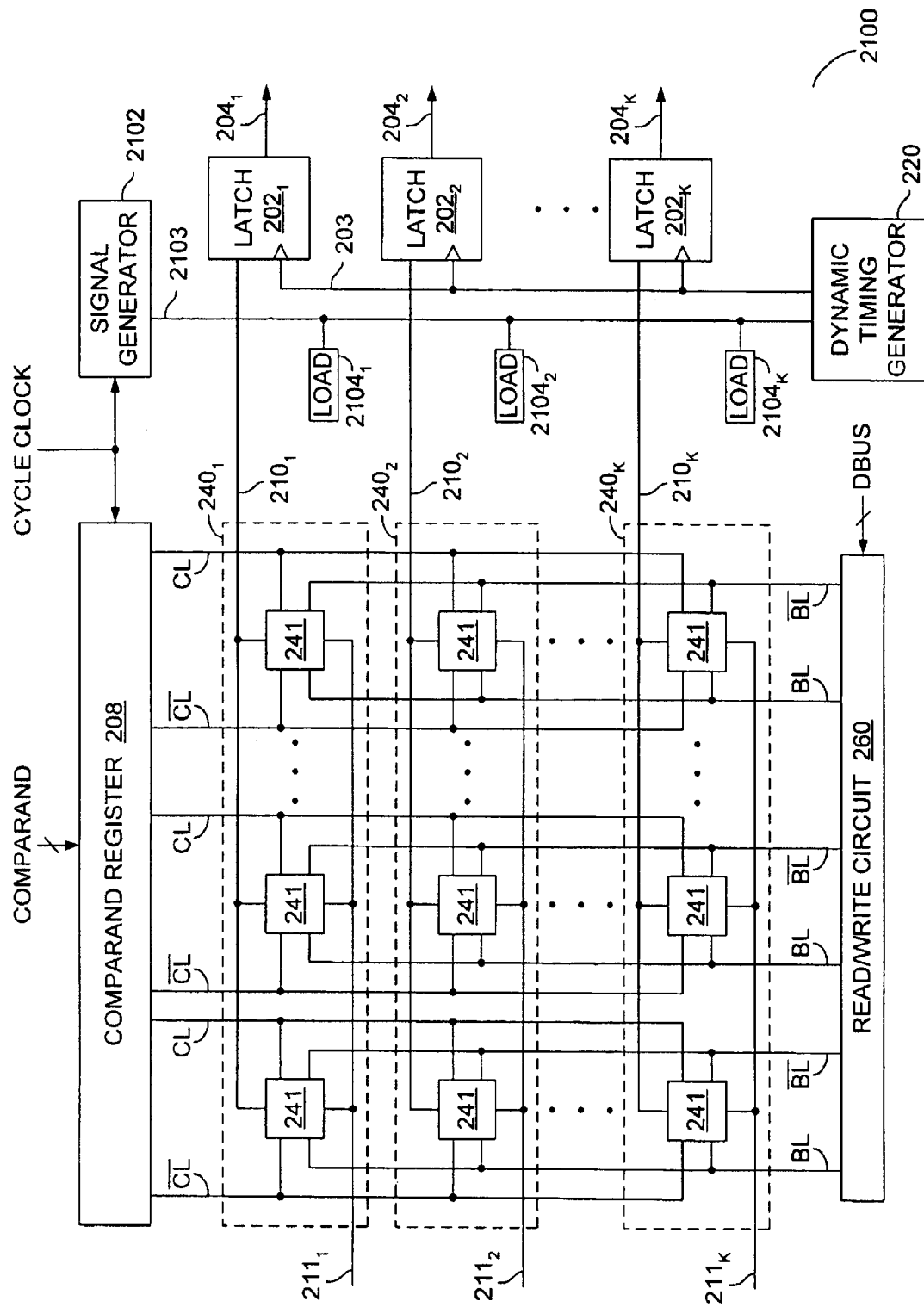
FIG. 21 shows another embodiment of the CAM architecture of FIG. 19.

FIG. 21 shows a CAM architecture 2100 in accordance with another embodiment of the present invention. CAM architecture 2100 includes all the elements of CAM architecture 1800 of FIG. 18, with the addition of signal generator 2102 and a plurality of load elements $2104_1$–$2104_k$ coupled to signal line 2103. As shown in FIG. 21, there is one load element $2104_1$–$2104_k$ associated with each corresponding CAM row $240_1$–$240_k$, however, for other embodiments, fewer load elements may be used. Load elements $2104_1$–$2104_k$ model the load on the comparand lines such that the total load on signal line 2103 is greater than or equal to that of the comparand lines. Load elements $2104_1$–$2104_k$ may be, for example, the load elements $2104_1$–$2104_k$ described above with respect to FIG. 19 and FIG. 20. For one embodiment, an unused column of CAM cells (e.g., a column of CAM cells that do not affect the match results for the corresponding rows of CAM cells) may be used as load elements $2104_1$–$2104_k$, and one of its comparand signal lines may be used for signal line 2103. The signal line 2103 may be fabricated in the same manner that other column signal lines 2103 are fabricated (e.g., using the same conductive layer(s), materials and geometries). For an alternative embodiment, signal line 2103 can be fabricated to have the desired loading without using load elements $2104_1$–$2104_k$, but adjusting the conductive properties (e.g., adjusting one or more of the conductive material(s) comprising the signal line, geometries, number of fabrication process layers, etc.) of the signal line 2103 to effect the appropriate loading.

Signal generator 2102 asserts an enable signal on signal line 2103 at approximately the same time that comparand register 208 outputs comparand data on the comparand signal lines CL and $\overline{CL}$. When dynamic timing generator 220 receives the asserted enable signal on signal line 2103, dynamic timing generator 220 outputs its latch enable signal on signal line 203. For an alternative embodiment, the enable signal on signal line 2103 enables dynamic timing generator to start its operations.

Since dynamic timing generator 220 will not assert the latch enable signal on signal line 203 until after the entire CAM array has received the comparand data and has commenced its compare operations, the latch enable signal on signal line 203 will cause latches 202 to capture the correct match results for a given compare operation.

Signal generator 2102 can output and assert the enable signal on signal line 2103, for example, in response to the cycle clock. Signal generator 2102 may be any suitable signal generator circuit. For one embodiment, signal 2102 is a one-shot circuit. For other embodiments, signal generator 2102 may be part of comparand register 208 (e.g., a bit stored in comparand register 208) or may be the cycle clock or a derivative thereof.

For other embodiments of CAM architecture 2100, signal generator 2103 may assert the enable signal on signal line 2103 after the comparand data is driven onto the comparand lines. In this embodiment, the load elements $2104_1$–$2104_k$ may be designed to provide at least the same load as that on the comparand signal lines, or load elements $2104_1$–$2104_k$ may provide more or greater delay to the enable signal on signal line 2103.

While FIG. 21 shows that dynamic timing generator 220 may be disposed at the opposite end of the CAM array from comparand register 208, in other embodiments, dynamic timing generator 220 may be disposed at other location relative to comparand register 208. For one embodiment, multiple dynamic timing generators may be used. For one embodiment, multiple dynamic timing generators may be coupled to signal line 2103 and each transmitting a local latch enable signal to a subset of the latches $202_1$–$202_K$. For one example, a first dynamic timing generator may be coupled to the midpoint of signal line 2103 and transmit a local latch enable signal to latches $202_1$–$202_{K/2}$, and a second dynamic timing generator may be coupled to the end of signal line 2103 and transmit a local latch enable signal to latches $202_{K/2+1}$–$202_K$. In other examples, any number of dynamic timing generators and local latch enable signals may be used.

Figure 22:
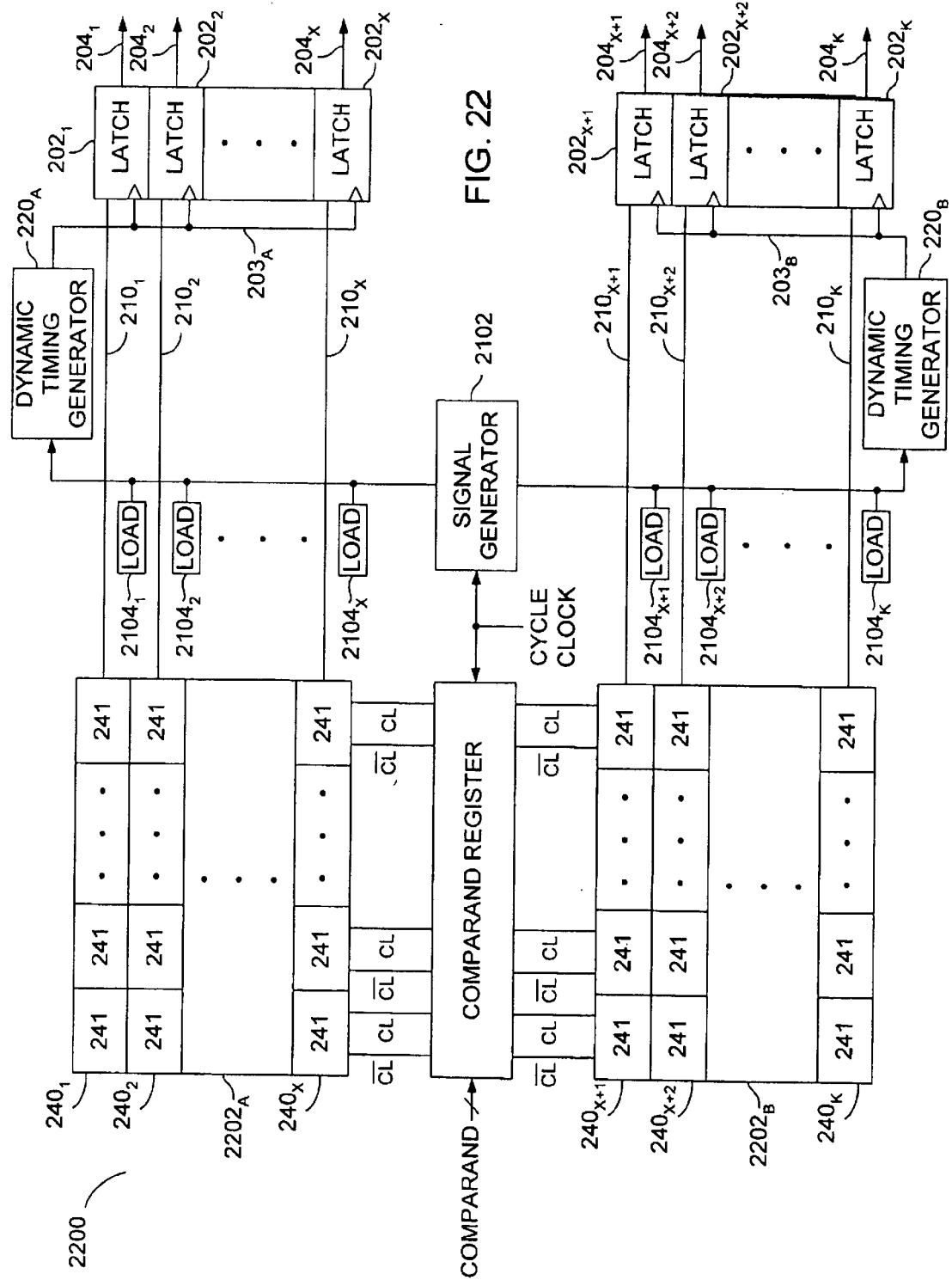
FIG. 22 shows another embodiment of a CAM architecture.

For another embodiment, comparand register 208 may be disposed between segments or subarrays $2202_A$ and $2202_B$ of the CAM array and multiple dynamic timing generator circuits $220_A$ and $220_B$ may be used, as shown, for example, in CAM architecture 2200 of FIG. 22, to reduce the propagation delay times on the comparand lines and latch match results earlier in time than that shown in FIG. 21. CAM subarray $2202_A$ includes the first X rows of the CAM array $240_1$–$240_X$, and CAM subarray 220B includes the balance of the K rows of CAM array $240_{X+1}$–$240_K$. While X may be one half of K, in other embodiments, X may be any number and the comparand register disposed between rows $240_X$ and $240_{X+1}$.

Dynamic timing generator $220_A$ is disposed at the top of subarray $2202_A$ and receives an enable signal from signal generator 2102 over signal line $2103_A$, which is loaded by load elements $2104_1$–$2104_X$. Similarly, dynamic timing generator $220_B$ is disposed at the bottom of subarray $2202_B$ and receives an enable signal from signal generator 2102 over signal line $2103_B$, which is loaded by load elements $2104_{X+1}$–$2104_K$. As in FIG. 21, CAM architecture 2200 includes one load element $2104_1$–$2104_k$ associated with each corresponding CAM row $240_1$–$240_k$, however, for other embodiments, fewer load elements may be used. Load elements $2104_1$–$2104_k$ model the load on the comparand lines associated with the corresponding subarray such that the total load on the respective signal lines $2103_A$ and $2103_B$ is greater than or equal to that of the corresponding comparand lines. Load elements $2104_1$–$2104_k$ may be, for example, the load elements $2104_1$–$2104_k$ described above with respect to FIG. 19 and FIG. 20.

Signal generator 2102 asserts enable signals on signal lines $2103_A$ and $2103_B$ at approximately the same time that comparand register 208 outputs comparand data on the comparand signal lines CL and $\overline{CL}$ to each of the subarrays. When the dynamic timing generator $220_A$ and $220_B$ receive their asserted enable signals on signal lines $2103_A$ and $2103_B$ respectively, dynamic timing generator $220_A$ outputs its latch enable signal on signal line $203_A$ to latches $202_1$–$202_X$ and dynamic timing generator $220_B$ outputs its latch enable signal on signal line $203_B$ to latches $202_{X+1}$–$202_K$. For an alternative embodiment, the enable signals on signal lines $2103_A$ and $2103_B$ enable the dynamic timing generators to start their operations. Since the dynamic timing generators will not assert their latch enable signals until after their respective subarrays have received their comparand data and have commenced their compare operations, the latch enable signals on signal lines $203_A$ and $203_B$ will cause latches $202_1$–$202_K$ to capture the correct match results for a given compare operation.

For other embodiments, the CAM array may be further segmented into any number of subarrays having comparand registers disposed therebetween and associated dynamic timing generators associated therewith.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) architecture comprising:
   a plurality of rows of CAM cells, each row configured to generate match results on a corresponding match line;
   a number of comparand lines each coupled to a corresponding CAM cell in each of the plurality of rows of CAM cells;
   a plurality of timed storage circuits, each having a data input coupled to a corresponding match line and having an enable input coupled to an enable signal line;
   a timing generator configured to generate an enable signal on the enable signal line; and a plurality of load elements coupled to the enable signal line.

2. The CAM architecture of claim 1, wherein the plurality of load elements and the plurality of timed storage circuits load the enable signal line at least as much as the CAM cells load one of the comparand lines.

3. The CAM architecture of claim 1, wherein a propagation delay of the enable signal over the enable signal line is at least equal to a propagation delay of a comparand signal over one of the comparand lines.

4. The CAM architecture of claim 1, wherein each load element models the load of a corresponding CAM cell on one of the comparand lines.

5. The CAM architecture of claim 1, wherein the plurality of load elements each comprise a transistor.

6. The CAM architecture of claim 5, wherein each transistor models a gate capacitance of a compare circuit in a corresponding CAM cell coupled to one of the comparand lines.

7. The CAM architecture of claim 1, wherein the timing generator comprises at least one row of CAM cells.

8. The CAM architecture of claim 1, wherein the timing generator comprises a static timing generator.

9. The CAM architecture of claim 1, wherein the timing generator comprises a dynamic timing generator.

10. The CAM architecture of claim 9, wherein the dynamic timing generator comprises a first compare circuit.

11. The CAM architecture of claim 10, wherein the dynamic timing generator circuit further comprises:
   a storage circuit coupled to an input of the first compare circuit; and
   a sense circuit coupled to an output of the first compare circuit.

12. The CAM architecture of claim 10, wherein the dynamic timing generator further comprises:
   a match comparison timing circuit including the first compare circuit and having an output to assert a first signal indicative of when the match results indicate that comparand data matches data stored in at least one of the rows of CAM cells;
   a mis-match comparison timing circuit including a second compare circuit and having an output to assert a second signal indicative of when the match results indicate that the comparand data mis-matches the data stored in at least another one of the rows of CAM cells; and
   a select circuit having inputs coupled to receive the first and second signals, and having an output to provide the enable signal.

13. A content addressable memory (CAM) architecture comprising:
   a CAM array including a plurality of rows of CAM cells, each row configured to generate match results on a corresponding match line;
   a number of comparand lines each coupled to a corresponding CAM cell in each of the plurality of rows of CAM cells;
   a plurality of timed storage circuits, each having a data input coupled to a corresponding match line and having an enable input to receive an enable signal;
   a plurality of load elements coupled to a signal line; and
   a timing generator having an input to receive a signal from the signal line, and an output to provide the enable signal.

14. The CAM architecture of claim 13, further comprising a signal generator coupled to the signal line to provide the signal.

15. The CAM architecture of claim 14, wherein the signal generator comprises a one-shot circuit.

16. The CAM architecture of claim 13, wherein the plurality of load elements load the signal line at least as much as the CAM cells load one of the comparand lines.

17. The CAM architecture of claim 13, wherein a propagation delay of the signal over the signal line is at least equal to a propagation delay of a comparand signal over one of the comparand lines.

18. The CAM architecture of claim 13, wherein each load element models the load of a corresponding CAM cell on one of the comparand lines.

19. The CAM architecture of claim 13, wherein the plurality of load elements each comprise a transistor.

20. The CAM architecture of claim 19, wherein each transistor models a gate capacitance of a compare circuit in a corresponding CAM cell coupled to one of the comparand lines.

21. The CAM architecture of claim 13, wherein the timing generator comprises at least one row of CAM cells.

22. The CAM architecture of claim 13, wherein the timing generator comprises a static timing generator.

23. The CAM architecture of claim 22, wherein the timing generator comprises a dynamic timing generator.

24. The CAM architecture of claim 23, wherein the dynamic timing generator comprises a first compare circuit.

25. The CAM architecture of claim 24, wherein the dynamic timing generator circuit further comprises:
   a storage circuit coupled to an input of the first compare circuit; and
   a sense circuit coupled to an output of the first compare circuit.

26. The CAM architecture of claim 24, wherein the dynamic timing generator further comprises:
   a match comparison timing circuit including the first compare circuit and having an output to assert a first signal indicative of when the match results indicate that comparand data matches data stored in at least one of the rows of CAM cells;
   a mis-match comparison timing circuit including a second compare circuit and having an output to assert a second signal indicative of when the match results indicate that the comparand data mis-matches the data stored in at least another one of the rows of CAM cells; and
   a select circuit having inputs coupled to receive the first and second signals, and having an output to provide the enable signal.

27. A content addressable memory (CAM) architecture comprising:
   a CAM array including a plurality CAM subarrays each having (i) a plurality of rows of CAM cells, each row configured to generate match results on a corresponding match line, and (ii) a plurality of comparand lines each coupled to a corresponding CAM cell in each of the plurality of rows of CAM cells;
   a comparand storage circuit coupled to the comparand lines of each of the CAM subarrays;
   a first plurality of timed storage circuits, each having a data input coupled to a corresponding match line of a first one of the CAM subarrays and having an enable input to receive a first enable signal;
   a second plurality of timed storage circuits, each having a data input coupled to a corresponding match line of a second one of the CAM subarrays and having an enable input to receive a second enable signal;
   a first plurality of load elements coupled to a first signal line;

a second plurality of load elements coupled to a second signal line;

a first timing generator having an input to receive a first signal from a first signal line, and an output to provide the first enable signal; and a second timing generator having an input to receive a second signal from a second signal line, and an output to provide the second enable signal.

28. The CAM architecture of claim 27, further comprising a signal generator coupled to the first and second signal lines to provide the first and second signals, respectively.

29. The CAM architecture of claim 28, wherein the signal generator comprises a one-shot circuit.

30. The CAM architecture of claim 27, wherein the first plurality of load elements load the first signal line at least as much as the CAM cells load one of the comparand lines in the first CAM subarray, and wherein the second plurality of load elements load the second signal line at least as much as the CAM cells load one of the comparand lines in the second CAM subarray.

31. The CAM architecture of claim 27, wherein a propagation delay of the first signal over the first signal line is at least equal to a propagation delay of a comparand signal over one of the comparand lines of a first CAM subarray, and wherein a propagation delay of the second signal over the second signal line is at least equal to a propagation delay of a comparand signal over one of the comparand lines of a second CAM subarray.

32. The CAM architecture of claim 27, wherein each of the first plurality of load elements models the load of a corresponding CAM cell on one of the comparand lines of a first CAM subarray, and wherein each of the second plurality of load elements models the load of a corresponding CAM cell on one of the comparand lines of a second CAM subarray.

33. The CAM architecture of claim 27, wherein the first and second timing generators each comprise at least one row of CAM cells.

34. The CAM architecture of claim 27, wherein the first and second timing generators each comprise a static timing generator.

35. The CAM architecture of claim 27, wherein the first and second timing generators each comprise a dynamic timing generator.

36. The CAM architecture of claim 35, wherein the first dynamic timing generator comprises a first compare circuit.

37. The CAM architecture of claim 36, wherein the first dynamic timing generator circuit further comprises:

a storage circuit coupled to an input of the first compare circuit; and a sense circuit coupled to an output of the first compare circuit.

38. The CAM architecture of claim 35, wherein the second dynamic timing generator comprises a first compare circuit.

39. The CAM architecture of claim 38, wherein the second dynamic timing generator circuit further comprises:

a storage circuit coupled to an input of the first compare circuit; and a sense circuit coupled to an output of the first compare circuit.

40. The CAM architecture of claim 35, wherein the first and second dynamic timing generators each comprise:

a match comparison timing circuit including a first compare circuit and having an output to assert a first signal indicative of when the match results indicate that comparand data matches data stored in at least one of the rows of CAM cells of the corresponding CAM subarray;

a mis-match comparison timing circuit including a second compare circuit and having an output to assert a second signal indicative of when the match results indicate that the comparand data mismatches the data stored in at least another one of the rows of CAM cells of the corresponding CAM subarray; and a select circuit having inputs coupled to receive the first and second signals, and having an output to provide the respective first or second enable signal.

41. A method comprising:

loading an enable signal line to have at least the same amount of loading as a comparand signal line coupled to a column of content addressable memory (CAM) cells in an array of CAM cells;

comparing comparand data with data stored in a plurality of rows of the CAM cells and generating match results on a plurality of match lines; and capturing the match results in response to an enable signal on the enable signal line.

42. The method of claim 41, further comprising:

dynamically determining a worst-case period of time that it would take one of the rows of CAM cells to determine its match results; and asserting the enable signal after dynamically determining the worst-case period of time.

43. The method of claim 42, wherein the dynamically determining comprises performing a compare operation in a row of CAM cells that does not participate in the comparison of the comparand data.

44. The method of claim 42, wherein the dynamically determining comprises:

comparing first data with second data to generate a first comparison result;

comparing the first data with third data to generate a second comparison result; and selecting either the first or second comparison result.

45. A method comprising:

transmitting a first signal on a first signal line to a timing generator, the first signal line having at least the same amount of loading as a comparand signal line coupled to a column of content addressable memory (CAM) cells in an array of CAM cells;

comparing comparand data with data stored in a plurality of rows of the CAM cells and generating match results on a plurality of match lines;

outputting a second signal from the timing generator to a second signal line after receiving the first signal on the signal line; and capturing the match results in response to the second signal.

46. The method of claim 45, further comprising dynamically determining a worst-case period of time that it would take one of the rows of CAM cells to determine its match results.

47. The method of claim 46, wherein the dynamically determining comprises performing a compare operation in a row of CAM cells that does not participate in the comparison of the comparand data.

48. The method of claim 46, wherein the dynamically determining comprises:

comparing first data with second data to generate a first comparison result;

comparing the first data with third data to generate a second comparison result; and selecting either the first or second comparison result.

* * * * *